US008637954B2

(12) United States Patent
Meyer et al.

(10) Patent No.: US 8,637,954 B2
(45) Date of Patent: Jan. 28, 2014

(54) INTEGRATED CIRCUIT TECHNOLOGY WITH DIFFERENT DEVICE EPITAXIAL LAYERS

(75) Inventors: Thorsten Meyer, München (DE); Wolfgang Werner, Munich (DE); Christoph Kadow, Gauting (DE)

(73) Assignee: Infineon Technologies AG, Neubiberg (DE)

( * ) Notice: Subject to any disclaimer, the term of this patent is extended or adjusted under 35 U.S.C. 154(b) by 368 days.

(21) Appl. No.: 12/911,009

(22) Filed: Oct. 25, 2010

(65) Prior Publication Data

US 2012/0098083 A1    Apr. 26, 2012

(51) Int. Cl.
*H01L 21/70*    (2006.01)
*H01L 21/332*    (2006.01)

(52) U.S. Cl.
USPC .......................................... 257/500; 438/139

(58) Field of Classification Search
USPC .......................................... 257/500; 438/139
See application file for complete search history.

(56) References Cited

U.S. PATENT DOCUMENTS

| | | | | |
|---|---|---|---|---|
| 4,346,513 A | * | 8/1982 | Nishizawa et al. | 438/187 |
| 4,882,294 A | * | 11/1989 | Christenson | 438/340 |
| 5,168,089 A | * | 12/1992 | Feyenson et al. | 117/88 |
| 5,294,823 A | * | 3/1994 | Eklund et al. | 257/370 |
| 5,374,569 A | * | 12/1994 | Yilmaz et al. | 438/203 |
| 5,496,758 A | * | 3/1996 | Ema | 438/253 |
| 5,930,648 A | * | 7/1999 | Yang | 438/443 |
| 5,994,188 A | * | 11/1999 | Disney | 438/268 |
| 7,772,652 B2 | | 8/2010 | Meyer et al. | |
| 2002/0089028 A1 | * | 7/2002 | Nagatani et al. | 257/492 |
| 2003/0160270 A1 | | 8/2003 | Pfirsch et al. | |
| 2005/0275025 A1 | | 12/2005 | Lanzerstorfer | |
| 2010/0078716 A1 | | 4/2010 | Bacher et al. | |

FOREIGN PATENT DOCUMENTS

| | | |
|---|---|---|
| DE | 10203164 B4 | 6/2005 |
| DE | 102004021391 A1 | 11/2005 |
| DE | 102008058974 A1 | 4/2010 |

* cited by examiner

*Primary Examiner* — Fernando L Toledo
*Assistant Examiner* — Karen Kusumakar
(74) *Attorney, Agent, or Firm* — Murphy, Bilak & Homiller, PLLC

(57) ABSTRACT

A semiconductor die includes a substrate, a first device region and a second device region. The first device region includes an epitaxial layer on the substrate and one or more semiconductor devices of a first type formed in the epitaxial layer of the first device region. The second device region is spaced apart from the first device region and includes an epitaxial layer on the substrate and one or more semiconductor devices of a second type formed in the epitaxial layer of the second device region. The epitaxial layer of the first device region is different than the epitaxial layer of the second device region so that the one or more semiconductor devices of the first type are formed in a different epitaxial layer than the one or more semiconductor devices of the second type.

17 Claims, 48 Drawing Sheets

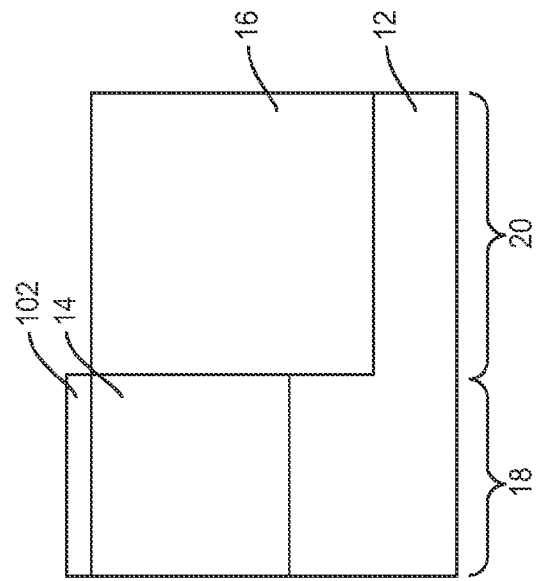
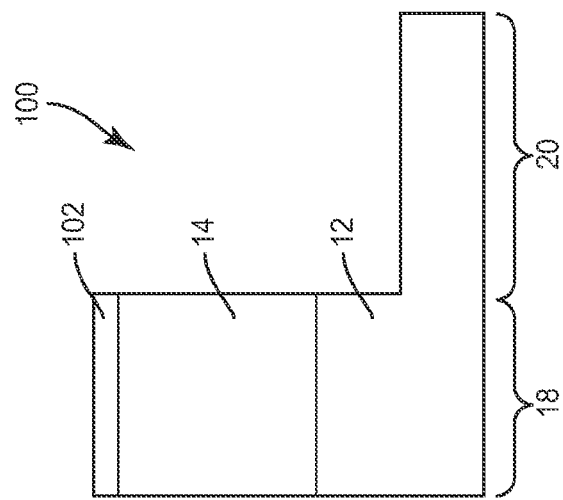
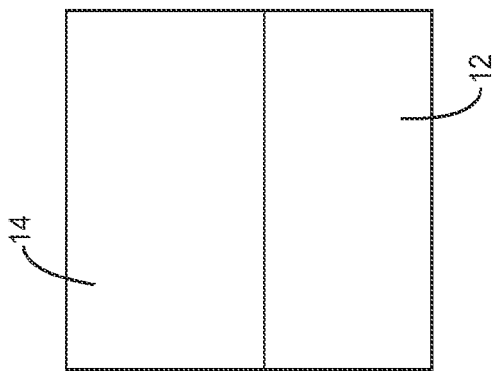
FIG. 20C
FIG. 20B
FIG. 20A

INTEGRATED CIRCUIT TECHNOLOGY WITH DIFFERENT DEVICE EPITAXIAL LAYERS

BACKGROUND

Some integrated CMOS-DMOS technologies include field plate trench DMOS (diffused metal oxide semiconductor) transistors to optimize on resistance. Optimization of field plate trench DMOS devices can be hindered in that the optimum epitaxial doping level for the DMOS transistor is by a factor of 3 to 10 higher than that for a regular well of a CMOS (complimentary metal oxide semiconductor) device for the same voltage class. Also, when integrating an isolated n-well into the technology e.g. for low side logic or isolated vertical bipolar devices, the required epitaxial thickness for the analog part of the technology is typically larger than that for an optimized field plate trench DMOS device (by up to a factor of 2.5). Furthermore, integrated circuit designs which use avalanche clamping instead of active zener devices to reduce the required voltage class of the DMOS device require a higher voltage class for the analog part of the integrated CMOS-DMOS technology compared to the DMOS device. This further increases the need for separate effective epitaxial thicknesses and doping levels for the DMOS devices and analog wells.

Conventional integrated CMOS-DMOS technologies typically use an epitaxial layer mostly defined by the requirements for the analog part of the technology and attempt to adapt the effective epitaxial doping and/or thickness locally for the DMOS part. In one example, an n-buried layer can be used for n-channel DMOS devices to effectively reduce the epitaxial thickness in the DMOS area. Another example involves oxidation enhanced diffusion of the n+ substrate to reduce epitaxial thickness underneath a DMOS device. In either case, only the thickness and doping level of the epitaxial layer close to the substrate can be controlled. A third example involves enhancing the doping of the epitaxial layer in the mesa region between trenches in the DMOS area by an additional high energy implant. This option increases the doping level in the mesa region, but the doping level is not increased by more than a factor of 2. Also, this option is typically limited to the upper part of the mesa region due to the energy limitations of common high energy implanters. Another example reduces the thickness of the epitaxial layer in the DMOS region by removing part of the epitaxial layer. None of these conventional techniques use a stacked or graded epitaxial layer for the DMOS devices and analog wells. Also, none of these conventional techniques address the problem of increased topography which arises due to the removal of material in the DMOS area.

To integrate a state of the art discrete DMOS device into a CMOS-DMOS technology, at least two of the techniques listed above are typically needed which substantially increases cost and process complexity. Also, the implicit limitations of such an approach still do not allow for full optimization of the DMOS device.

SUMMARY

A semiconductor die includes a substrate, a first device region and a second device region. The first device region includes an epitaxial layer on the substrate and one or more semiconductor devices of a first type formed in the epitaxial layer of the first device region. The second device region is spaced apart from the first device region and includes an epitaxial layer on the substrate and one or more semiconductor devices of a second type formed in the epitaxial layer of the second device region. The epitaxial layer of the first device region is different than the epitaxial layer of the second device region so that the one or more semiconductor devices of the first type are formed in a different epitaxial layer than the one or more semiconductor devices of the second type.

A method of fabricating a semiconductor die includes providing a substrate, forming a first device region including an epitaxial layer on the substrate and one or more semiconductor devices of a first type formed in the epitaxial layer of the first device region and forming a second device region spaced apart from the first device region and including an epitaxial layer on the substrate and one or more semiconductor devices of a second type formed in the epitaxial layer of the second device region. The epitaxial layer of the first device region is different than the epitaxial layer of the second device region so that the one or more semiconductor devices of the first type are formed in a different epitaxial layer than the one or more semiconductor devices of the second type.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 20A-20C are schematic cross-sectional views of a semiconductor die with a first device region and a second device region integrated on the same substrate during different processing steps according to a third embodiment.

DETAILED DESCRIPTION

According to the embodiments described herein, a semiconductor die includes a first device region and a second device region on the same semiconductor substrate. The first device region includes an epitaxial layer on the substrate and one or more semiconductor devices of a first type formed in the epitaxial layer of the first device region. That is, the first device region can include a single device e.g. one power DMOS in a one channel switch application or more than one device. The second device region is spaced apart from the first device region and includes an epitaxial layer on the substrate and one or more semiconductor devices of a second type formed in the epitaxial layer of the second device region. The epitaxial layer of the first device region is different than the epitaxial layer of the second device region so that the one or more semiconductor devices of the first type are formed in a different epitaxial layer than the one or more semiconductor devices of the second type. Each device region may include a plurality of spaced apart areas on the same die e.g. such as a two channel switch with the analog/logic part of the switch positioned in a middle or center of the die in the second device region and two power DMOS devices positioned to either side of the analog/logic part in the first device region. The semiconductor die can be fabricated with stacked epitaxial layers to separate the effective epitaxial properties of the first device region of the die e.g. a DMOS region and the second device region e.g. an analog/logic CMOS region according to various methods described herein. The semiconductor die can also be fabricated by selectively growing different epitaxial layers for first and second device regions of the die according to other methods described herein. Details of the different embodiments are described next in more detail.

Figure 1:
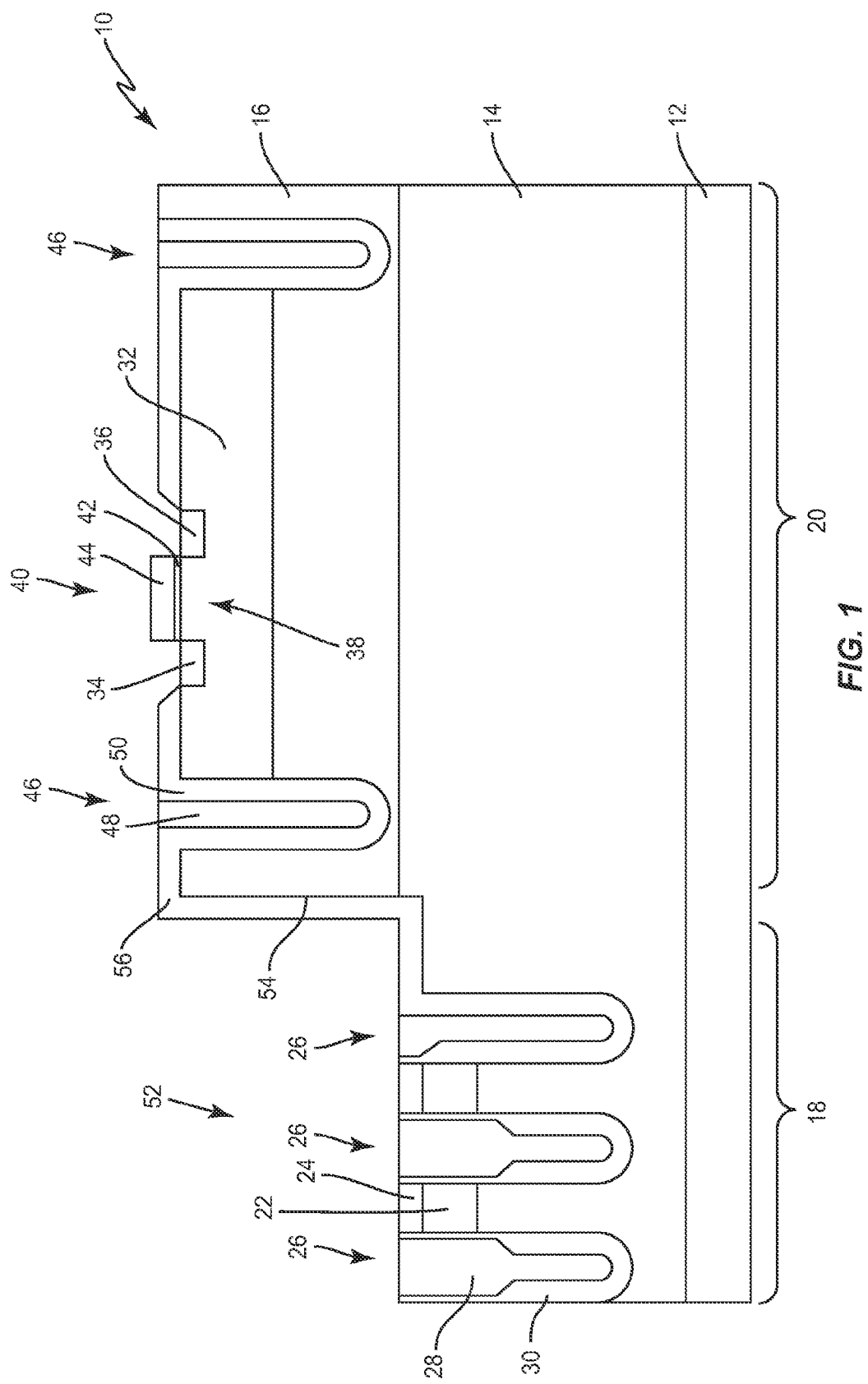
FIGS. 1-8 are schematic cross-sectional views of a semiconductor die with a first device region and a second device region integrated on the same substrate according to different embodiments.

FIG. 1 illustrates an embodiment of a semiconductor die 10. The semiconductor die 10 is an integrated die in that at least two different types of semiconductor devices are fabricated on the die 10. The die 10 includes a substrate 12, a first epitaxial layer 14 grown on the substrate 12 and a second epitaxial layer 16 grown on the first epitaxial layer 14. The first epitaxial layer 14 has a different thickness and/or different doping concentration than the second epitaxial layer 16. This way, the properties of the first epitaxial layer 14 can be optimized for semiconductor devices of a first type fabricated in a first device region 18 of the die 10 and the properties of the second epitaxial 16 can be optimized for semiconductor devices of a second type fabricated in a second device region 20 of the die 10 which is spaced apart from the first device region 18. The first device region 18 and/or the second device region 20 can include a plurality of spaced apart areas on the same die 10. For example, a two channel switch can be implemented with the analog/logic part of the switch positioned in the middle or center of the die 10 in the second device region 20 and two or more power DMOS devices can be positioned to either side of the analog/logic part in the first device region 18. Other types of circuits can be implemented with the different device types, and with at least one of the device regions 18, 20 including different spaced apart areas on the die 10. Alternatively, both the first device region 18 and the second device region 20 are both continuous.

In one embodiment, the semiconductor devices of the first type are DMOS transistors and the semiconductor devices of the second type are analog and/or logic CMOS transistors. Each of the one or more DMOS transistors are fabricated in the first epitaxial layer 14 which can be thinner and/or doped more heavily than the second epitaxial layer 16 which includes the CMOS transistors. According to an embodiment, the first epitaxial layer 14 has a 3×-30× higher doping concentration than the second epitaxial layer 16 and the second epitaxial layer 16 is 1.3 to 4 times as thick as the first epitaxial layer 14. For example, the first and second epitaxial layers 14, 16 can both be n-type, the first epitaxial layer 14 can have a doping concentration of about $4\mathrm{e}16\mathrm{cm}^{-3}$ and the second epitaxial layer 16 can have a doping concentration of about $3\mathrm{e}15\mathrm{cm}^{-3}$ for a 60V technology. The first epitaxial layer 14 can be about 4 to 5 μm thick and the second epitaxial layer 16 can be about 6 to 10 μm thick for the 60V technology. Of course, the epitaxial layers 14, 16 may have other thicknesses and/or doping concentrations depending on the maximum technology voltage, device types, circuit applications, etc.

Broadly, epitaxial properties can be optimized for different types of semiconductor devices fabricated on the same die by forming each type of semiconductor device in a different epitaxial layer. This way, one epitaxial layer can be optimized independent of the properties of the other device epitaxial layers. In FIG. 1, the first device region 18 includes the first epitaxial layer 14 and the semiconductor devices of the first type formed in the first epitaxial layer 14. The second device region 20 is spaced apart from the first device region 18 and includes the second epitaxial layer 16 and the semiconductor devices of the second type formed in the second epitaxial layer 16. As such, the semiconductor devices of the first type are formed in a different epitaxial layer than the semiconductor devices of the second type. According to the embodiment of FIG. 1, the first device region 18 is devoid of the second epitaxial layer 16. As such, the first device region 18 is vertically offset from the second device region 20 on the substrate 12.

The semiconductor devices of the first type can be e.g. DMOS transistors. A single DMOS transistor can be provided e.g. for a one channel switch application or more than one DMOS transistor can be provided e.g. for a multi-channel switch application. The DMOS transistors include a drain including the substrate 12 and the portion of the first epitaxial layer 14 between the substrate 12 and a body region 22. The body region 22 is adjacent the drain and source region 24 is adjacent the body region 22 so that the body 22 is interposed between the drain and the source 24 in a direction perpendicular to the main surface of the substrate 12. In some embodiments, the substrate 12, first epitaxial layer 14 and source 24 are n doped, and the body 22 is p doped. In other embodiments, these device regions have the opposite doping types. In either configuration, trenches 26 are formed in the first epitaxial layer 14. Each trench 26 is filled with a conductive material 28 that acts as a field plate insulated from the first epitaxial layer 14 by an insulating material 30.

The semiconductor devices of the second type can comprise a complete analog and/or logic device library of an integrated power technology, i.e. the devices of the second type can be low or high voltage MOS devices, bipolar devices, JFETS (junction field effect transistors), passive devices, etc. The semiconductor devices of the second type are formed in the second epitaxial layer 16 above the first epitaxial layer 14 in the second device region 20 of the die 10. In one embodiment, the substrate 12, first epitaxial layer 14 and the second epitaxial layer 16 are n-doped and a p-doped well 32 is formed in an upper portion of the second epitaxial layer 16. N-type source and drain regions 34, 36 are formed in the p-type well region 32, separated by a channel region 38. In other embodiments, these device regions have the opposite doping types. A gate structure 40 is formed above the channel region 38 for controlling the channel 38. The gate structure 40 includes a gate dielectric 42 separating the channel region 38 from a gate electrode 44. Trenches 46 can be formed in the second epitaxial layer 16 surrounding the p-well 32 to provide lateral isolation from other transistors formed in the second epitaxial layer 16, each trench 46 in the second device region 20 including a conductive material 48 insulated from the second epitaxial layer 16 by an insulating material 50.

The trenches 26, 46 of the first and second device regions 18, 20 are formed after processing of the first and second epitaxial layers 14, 16 according to this embodiment. The second epitaxial layer 16 is removed in the first device region 18 e.g. via plasma etching so that the semiconductor devices of the first type are placed in a valley 52. The valley has a vertical edge 54 in this embodiment covered with a field oxide 56. The first and second device regions 18, 20 share a limited number of photo processing steps, especially for fully optimized DMOS devices having a groove contact. The steps which are shared e.g. such as source n+ implant and body implant do not necessarily need to be structured within the DMOS device region 18. Instead, the photo process can be focused on the surface level of the analog/logic CMOS region 20 and use negative resist processing.

Figure 2:
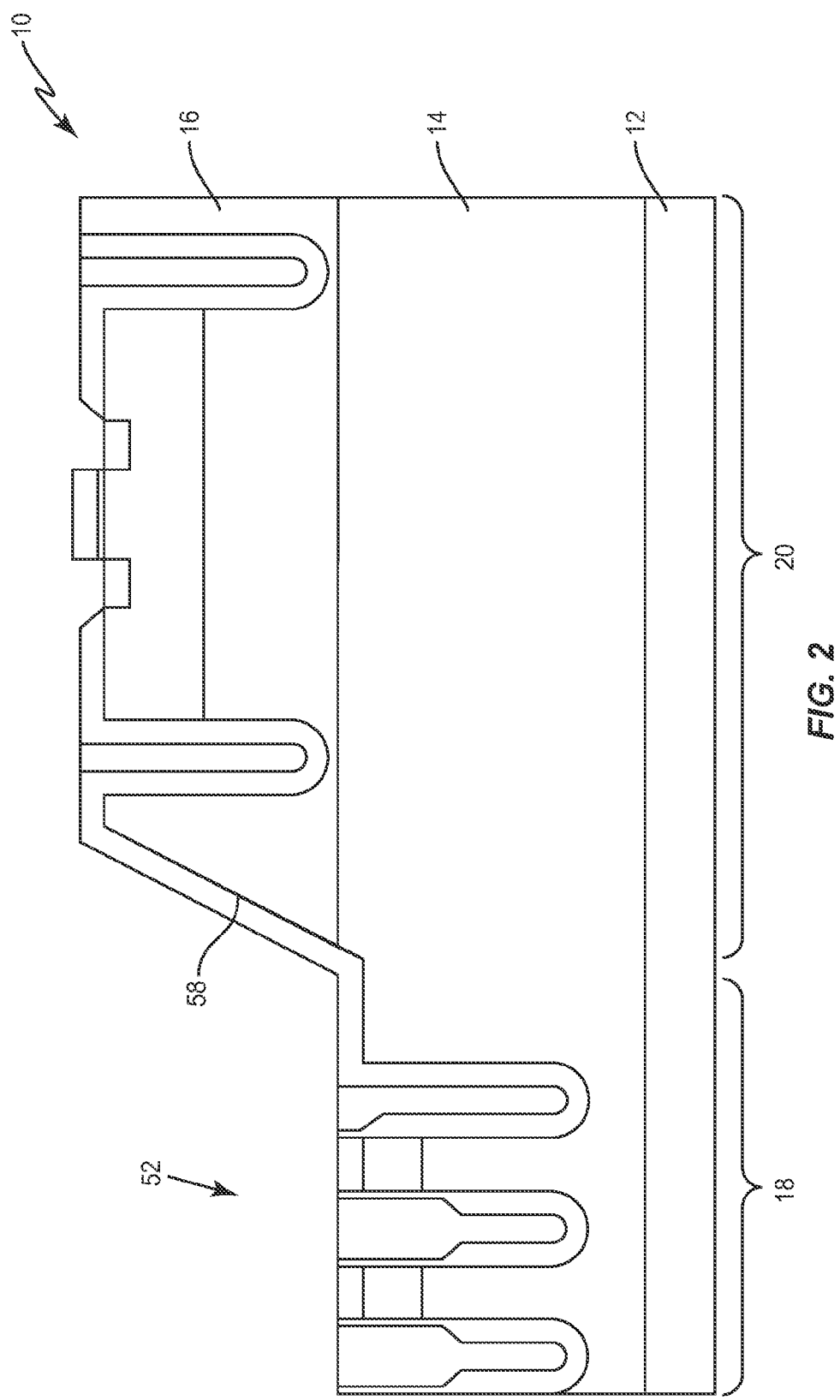

FIG. 2 illustrates a second embodiment of the semiconductor die 10. FIG. 2 is similar to FIG. 1, except the valley 52 separating the first and second device regions 18, 20 has an oblique step 58 instead of a step perpendicular to the main surface of the substrate 12 as shown in FIG. 1. The oblique valley step 58 results in improved resist coverage during processing.

Figure 3:
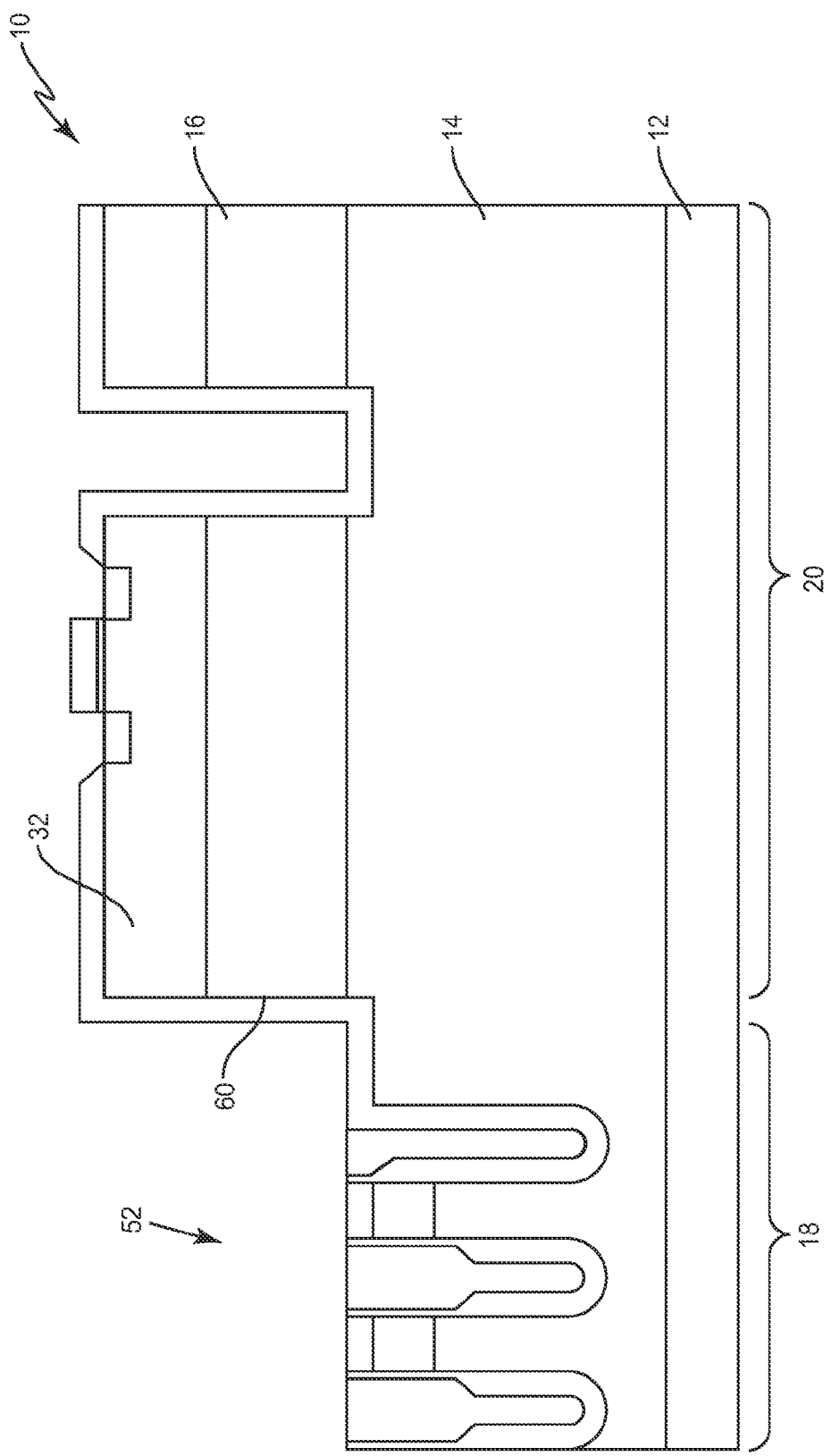

FIG. 3 illustrates a third embodiment of the semiconductor die 10. FIG. 3 is similar to FIG. 1, except the valley step 60 is also used for lateral isolation for the well region 32 in the second device region 20. That is, the well region 32 in the second device region 20 can be isolated by the valley edge 60 instead of by a trench as shown in FIG. 1. The valley edge 60 can be perpendicular to the main surface of the substrate 12 as shown in FIG. 1, or oblique as shown in FIG. 2 to improve resist coverage during processing.

Figure 4:
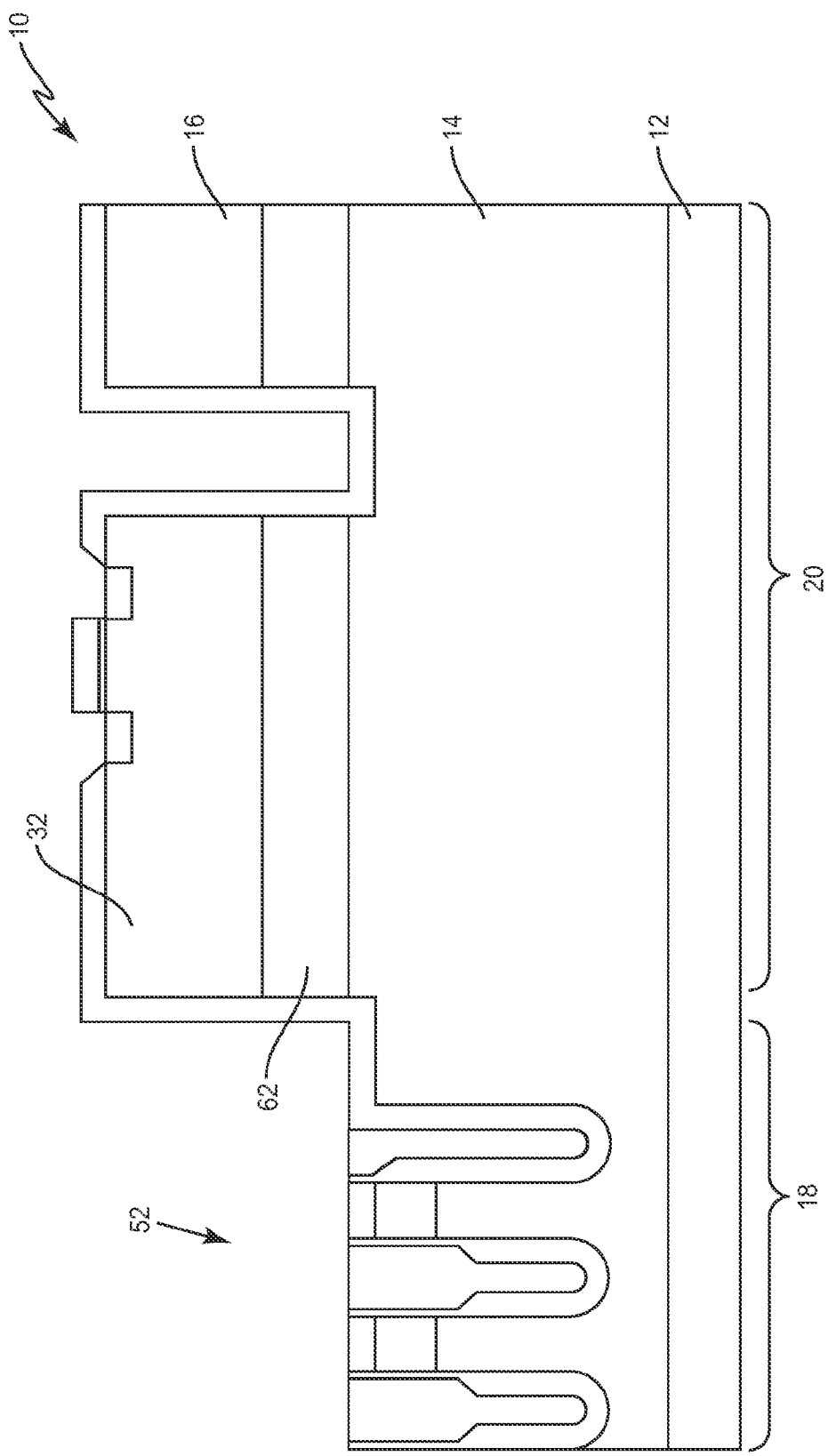

FIG. 4 illustrates a fourth embodiment of the semiconductor die 10. According to this embodiment, a highly doped region 62 of the same conductivity type as the well region 32 is disposed between the first epitaxial layer 14 and the second epitaxial layer 16 in the second device region 20. In one embodiment, the highly doped region 62 is formed by growing an additional epitaxial layer on the first epitaxial layer 14 and then growing the second epitaxial layer 16 on the additional epitaxial layer. The highly doped region 62 has the opposite conductivity type as the first and second epitaxial layers 14, 16. In another embodiment, the highly doped region 62 is a buried p-type layer between the two n-type epitaxial layers 14, 16. In either case, the highly doped region 62 provides improved substrate isolation. In yet another embodiment, the second epitaxial layer 16 can be made suitably thick to allow full voltage capability of the buried isolation layer 62 both toward the substrate 12 and toward the surface of the second epitaxial layer 16, allowing additional device construction options.

Figure 5:
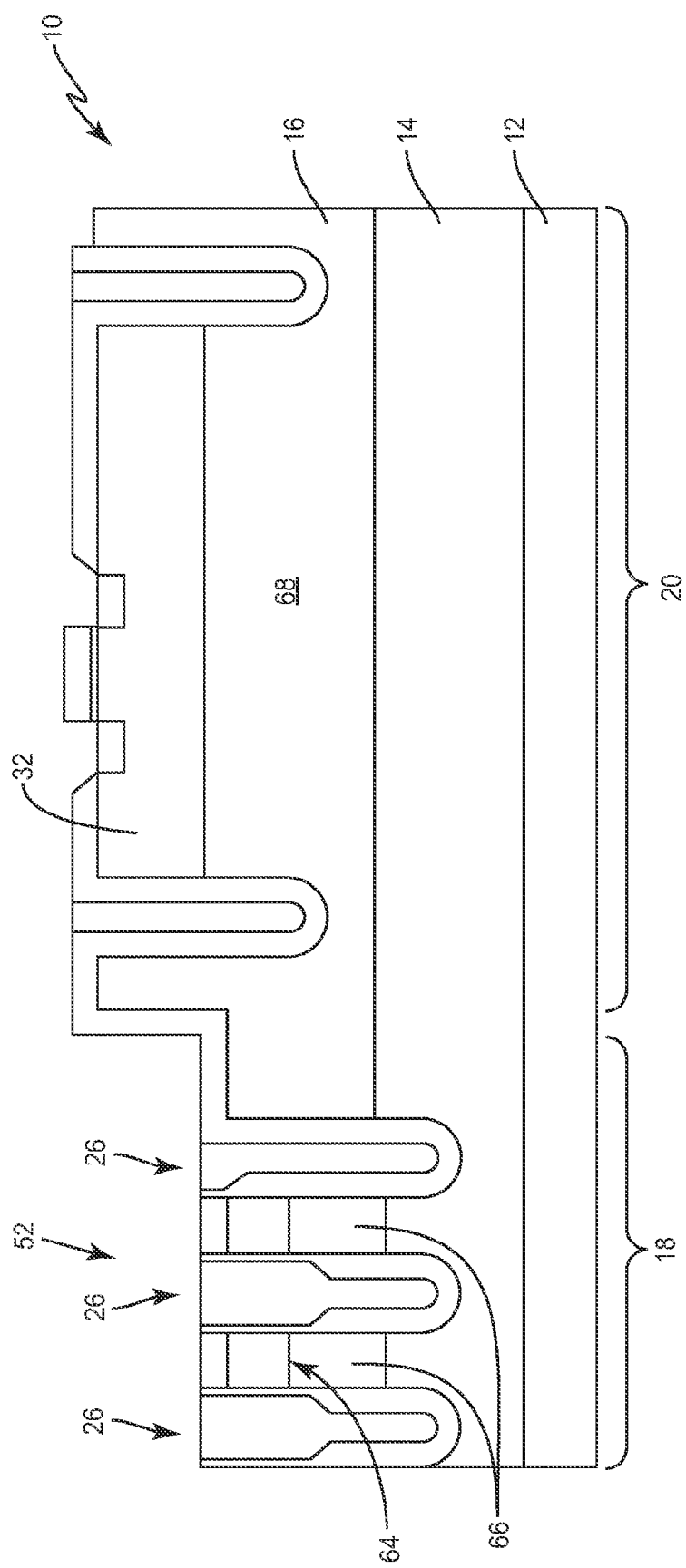

FIG. 5 illustrates a fifth embodiment of the semiconductor die 10. The first device region 18 is not completely devoid of the second epitaxial layer 16 according to this embodiment. In order to reduce the depth of the valley 52, the second epitaxial layer 16 can extend laterally into the first device region 18. For DMOS devices fabricated in the first device region 18, such a lateral extension of the second epitaxial layer 16 does not have any adverse effect on DMOS performance down to the body-drain junction 64. An additional n-type implant can be used to bridge the gap between the body-drain junction 64 and the more highly doped first epitaxial layer 14. In more detail, the first epitaxial layer 14 is grown on the substrate 12 and the second epitaxial layer 16 is grown on the first epitaxial layer 14. An upper portion of the second epitaxial layer 16 is removed in the first device region 18 so that the second epitaxial layer 16 is thicker in the second device region 20 than in the first device region 18. Accordingly, the second epitaxial layer 16 has a greater height in the second device region 20 than in the first device region 18. The second epitaxial layer 16 may also be doped more heavily in the first device region than in the second device region. In one embodiment, additional dopants are implanted into the mesa of semiconductor material disposed between the trenches 26 in the first device region 18 so that the second epitaxial layer 16 has more conductive areas 66 in the first device region 18 and is less conductive in the second device region 20. The semiconductor devices of the first type are formed in the more conductive areas 66 of the second epitaxial layer 16 in the first device region 18 and the semiconductor devices of the second type are formed in the less conductive area 68 of the second epitaxial layer 16 in the second device region 20.

Figure 6:
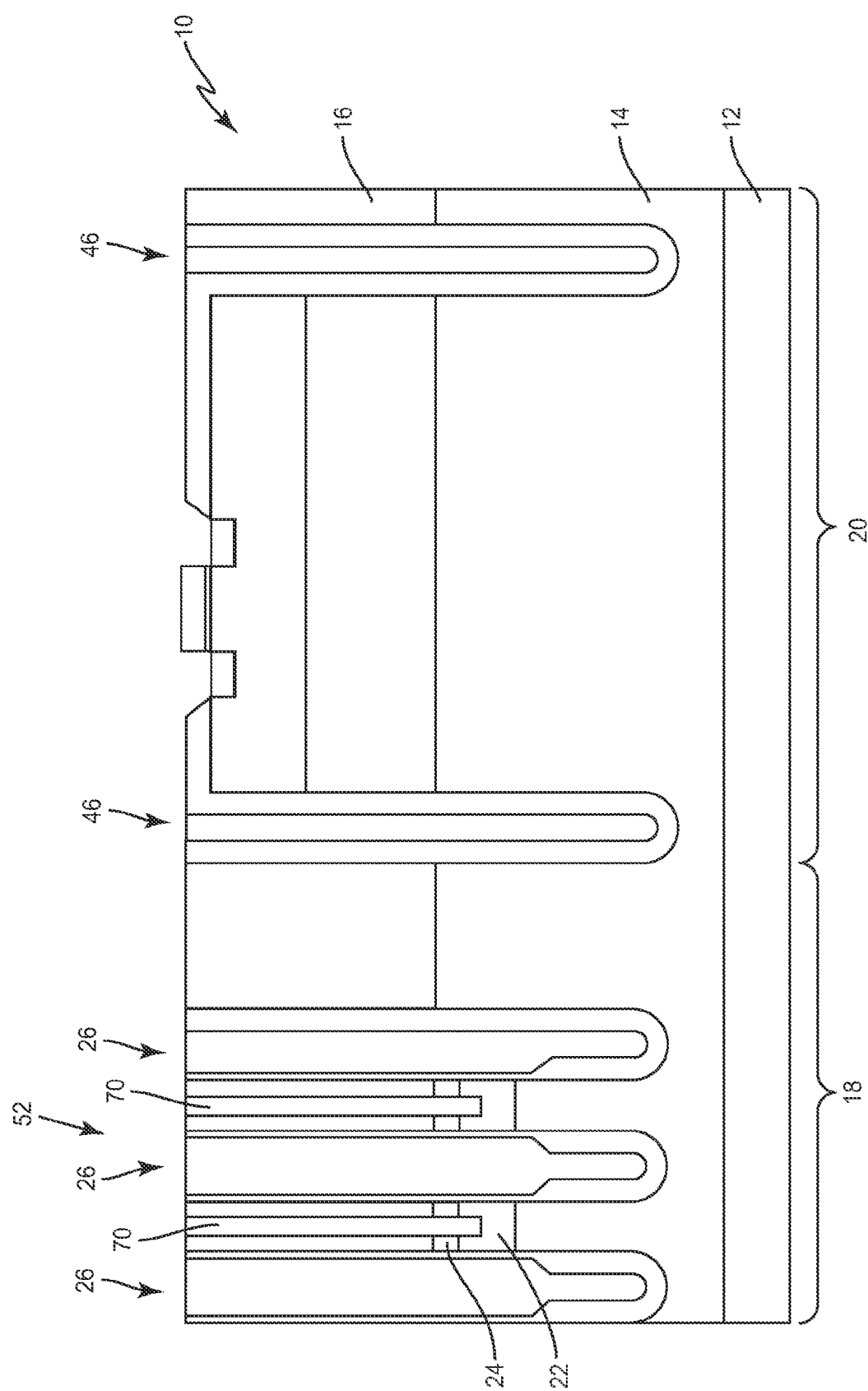

FIG. 6 illustrates a sixth embodiment of the semiconductor die 10. According to this embodiment, the second epitaxial layer 16 is not thinned in the first device region 18. This way, steps in the surface introduced by the silicon valleys 52 previously described herein are eliminated. Deeper trenches are provided for burying DMOS devices in the first device region 18. In more detail, the first epitaxial layer 14 is grown on the substrate 12 and the second epitaxial layer 16 is grown on the first epitaxial layer 14. The trenches 26, 46 in the first and second device regions 18, 20 are then formed so that the trenches 26, 46 extend through the first epitaxial layer 14 into the second epitaxial layer 16. Prior to filling the trenches 26 in the first device region 18 as previously described herein, dopants are implanted at an angle through the trenches 26 into the first epitaxial layer 16 to form the body region 22 and the source region 24, respectively, of the semiconductor devices of the first type. For example, p-type dopants may be implanted through the open trenches 26 to form the body region 22 and n-type dopants to form the source region 24. Of course, the body region 22 may instead be n-type and the source region 24 p-type. In either case, conductive contacts 70 are then formed to the semiconductor devices of the first type which extend through the second epitaxial layer 16 to the first epitaxial layer 14 in contact with the body region 22 and the source region 24. The semiconductor devices of the second type are formed in the second epitaxial layer 16 above the first epitaxial layer 14 in the second device region 20.

Figure 7:
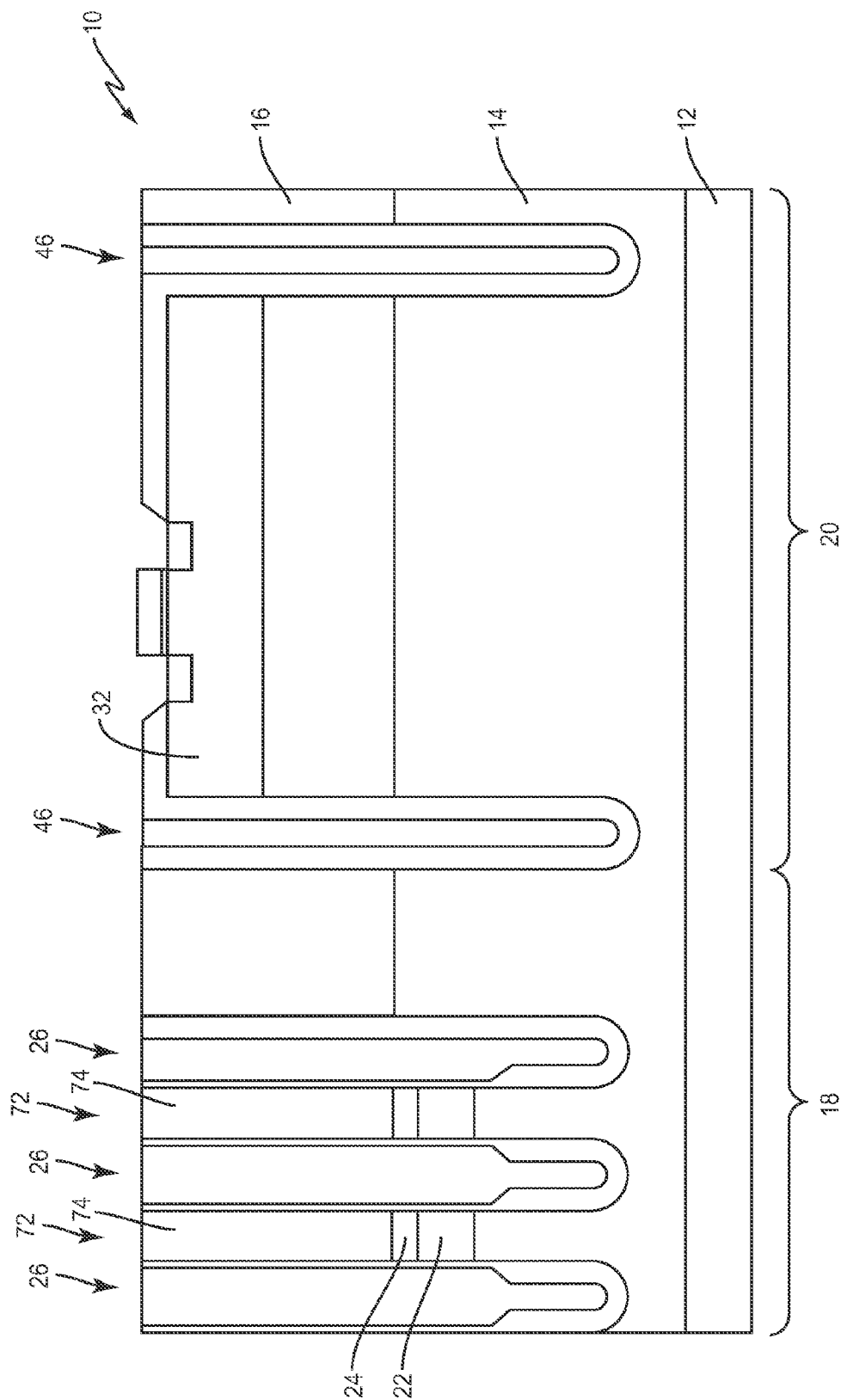

FIG. 7 illustrates a seventh embodiment of the semiconductor die 10. FIG. 7 is similar to FIG. 6, except the mesa of semiconductor material between the trenches 26 in the first device region 18 is recessed before source/body implant. The mesa recess can replace the contact hole etching step described above for DMOS devices. In more detail, the first epitaxial layer 14 is grown on the substrate 12 and the second epitaxial layer 16 is grown on the first epitaxial layer 14. Trenches 72 are formed that extend through the first epitaxial layer 14 into the second epitaxial layer 16. The trenches 46 of the second device region 20 can be formed at the same time. The portion of the second epitaxial layer 16 disposed between the trenches 72 in the first device region 18 is removed via an etch process to expose the underlying first epitaxial layer 14 in these regions. Dopants are then implanted between the trenches 72 into the exposed portion of the first epitaxial layer 14 to form the body and source regions 22, 24 of the DMOS devices in the first epitaxial layer 14 below the second epitaxial layer 16 in the first device region 18. The open space between the trenches 72 is filled with a conductive material 74 to form contacts to the body region 22 and the source region 24 of the DMOS devices. The semiconductor devices of the second type are formed in the second epitaxial layer 16 above the first epitaxial layer 14 in the second device region 20.

Figure 8:
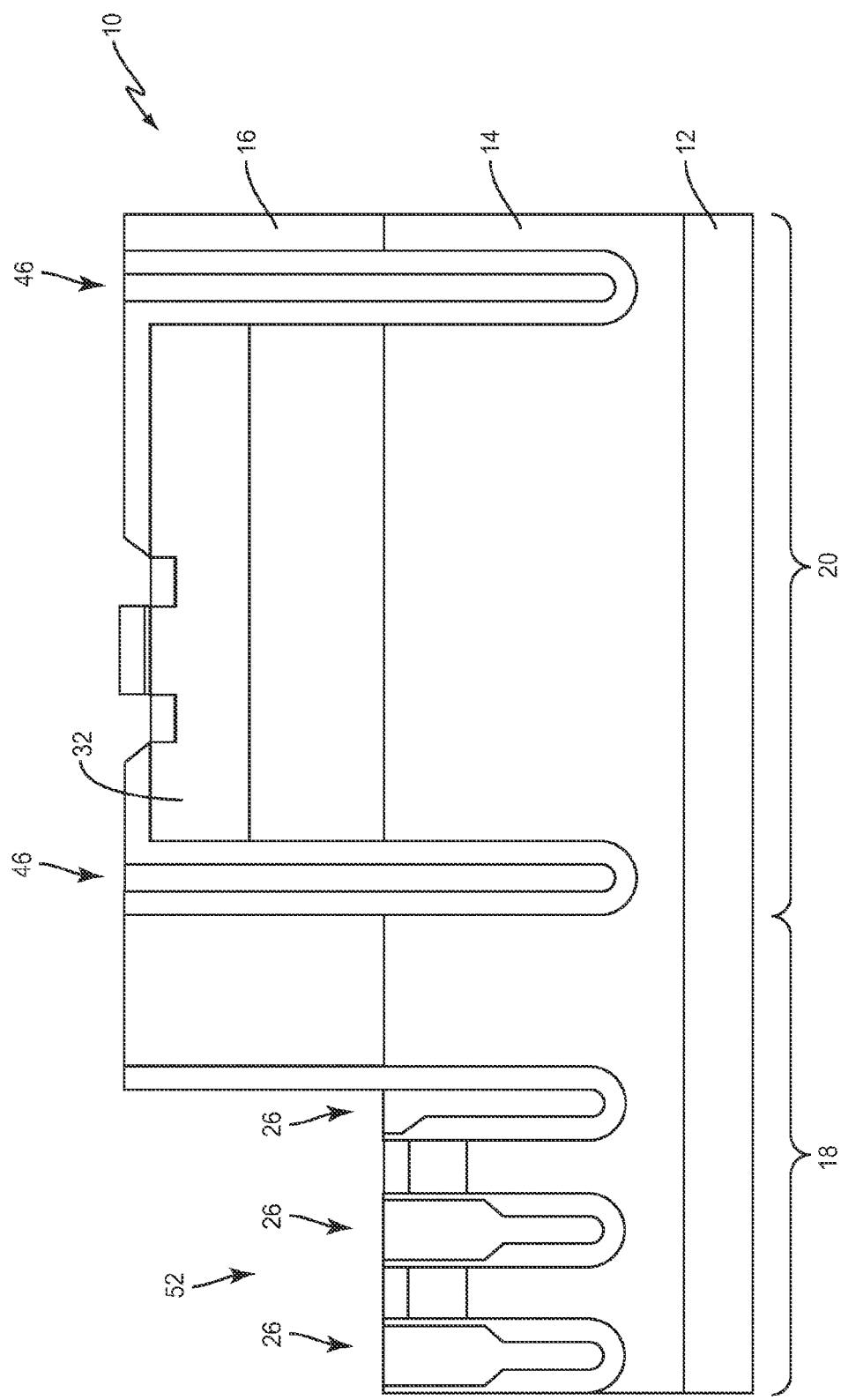

FIG. 8 illustrates an eighth embodiment of the semiconductor die 10. According to this embodiment, the valley 52 is formed in the first device region 18 by performing a mesa recess etch of the second epitaxial layer 16 after trench etching but prior to field oxide formation and field oxide structuring. Trenches 46 are formed in the second device region 20 for lateral isolation of the well region 32. The trenches 46 have a greater height in the second device region 20 than the trenches 26 in the first device region 18. Forming deep trenches 46 in the second device region 20 reduces sensitivity to lateral minority carrier current in reverse operation mode in the second device region 20. In more detail, the first epitaxial layer 14 is grown on the substrate 12 and the second epitaxial layer 16 is grown on the first epitaxial layer 14. Trenches 46 extending through the first epitaxial layer 14 into the second epitaxial layer 16 are formed in the first device region 18 and in the second device region 20 so that the trenches 26, 46 in the first and second device regions 18, 20 extend to the same depth in the first epitaxial layer 14. The second epitaxial layer 16 is thinned or completely removed in the first device region 20 after the trenches 26, 46 are formed. The semiconductor devices of the first type are then formed in the first epitaxial layer 14 in the first device region 18 and the semiconductor devices of the second type are formed in the second epitaxial layer 16 over the first epitaxial layer 14 in the second device region 20.

Figure 9:
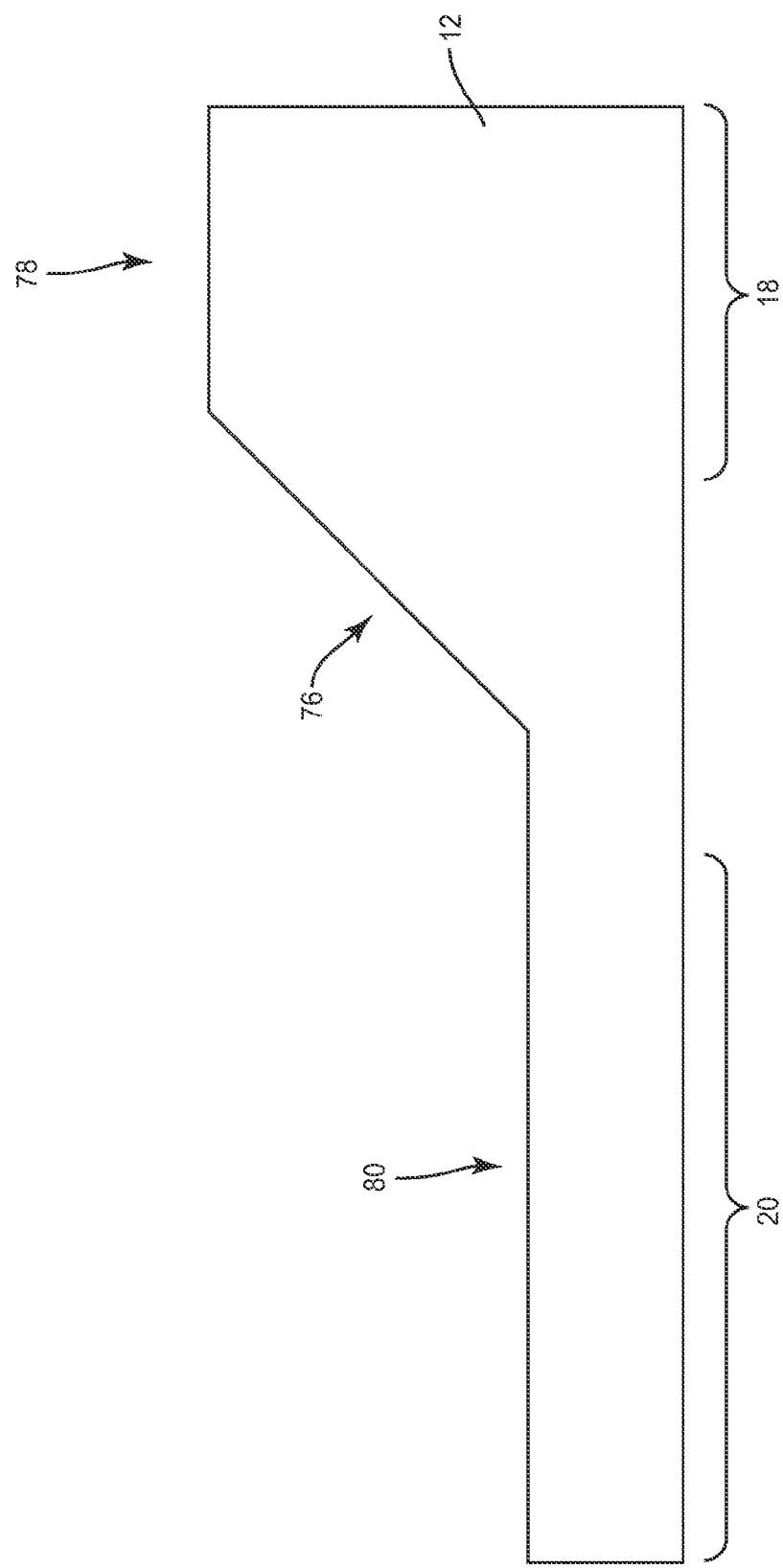
FIGS. 9-13 are schematic cross-sectional views of a semiconductor die with a first device region and a second device region integrated on the same substrate during different processing steps according to a first embodiment.
Figure 10:
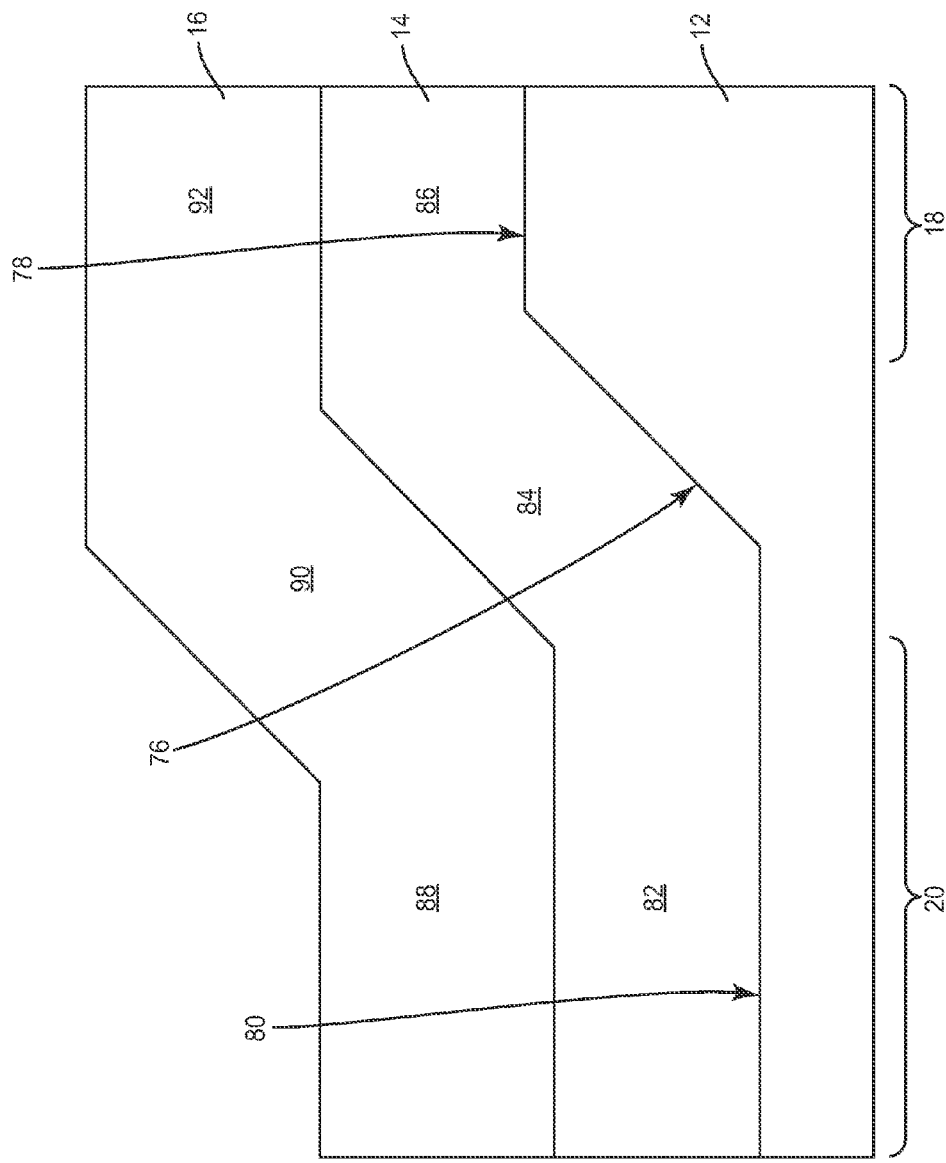

FIGS. 9-13 illustrate an embodiment of fabricating the semiconductor die 10 where the main substrate surface is structured prior to epitaxial processing. In more detail, an oblique step 76 is formed in the substrate 12 as shown in FIG. 9 so that the substrate 12 has an elevated section 78 for the first device region 18 and a recessed section 80 for the second device region 20. The first epitaxial layer 14 is grown on the elevated section 78 of the substrate 12, the recessed section 80 of the substrate 12 and the oblique step 76, and the second epitaxial layer 16 is grown on the first epitaxial layer 14 as shown in FIG. 10. The stepped contour of the substrate 12 transfers to the first and second epitaxial layers 14, 16. That is, the first epitaxial layer 14 has a lower section 82, an oblique stepped section 84 and an upper section 86. The second epitaxial layer 16 similarly has a lower section 88, an oblique stepped section 90 and an upper section 92.

Figure 11:
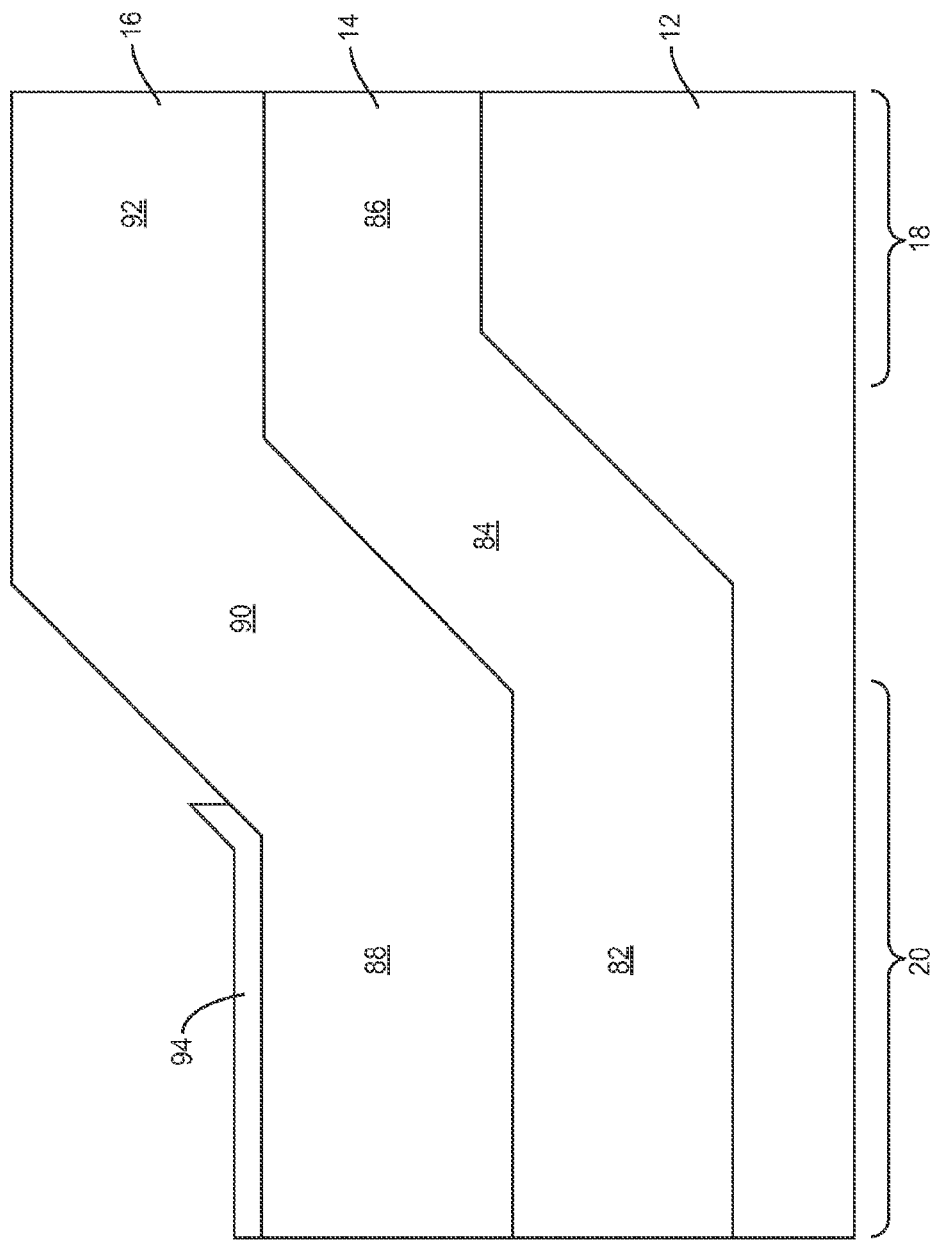
Figure 12:
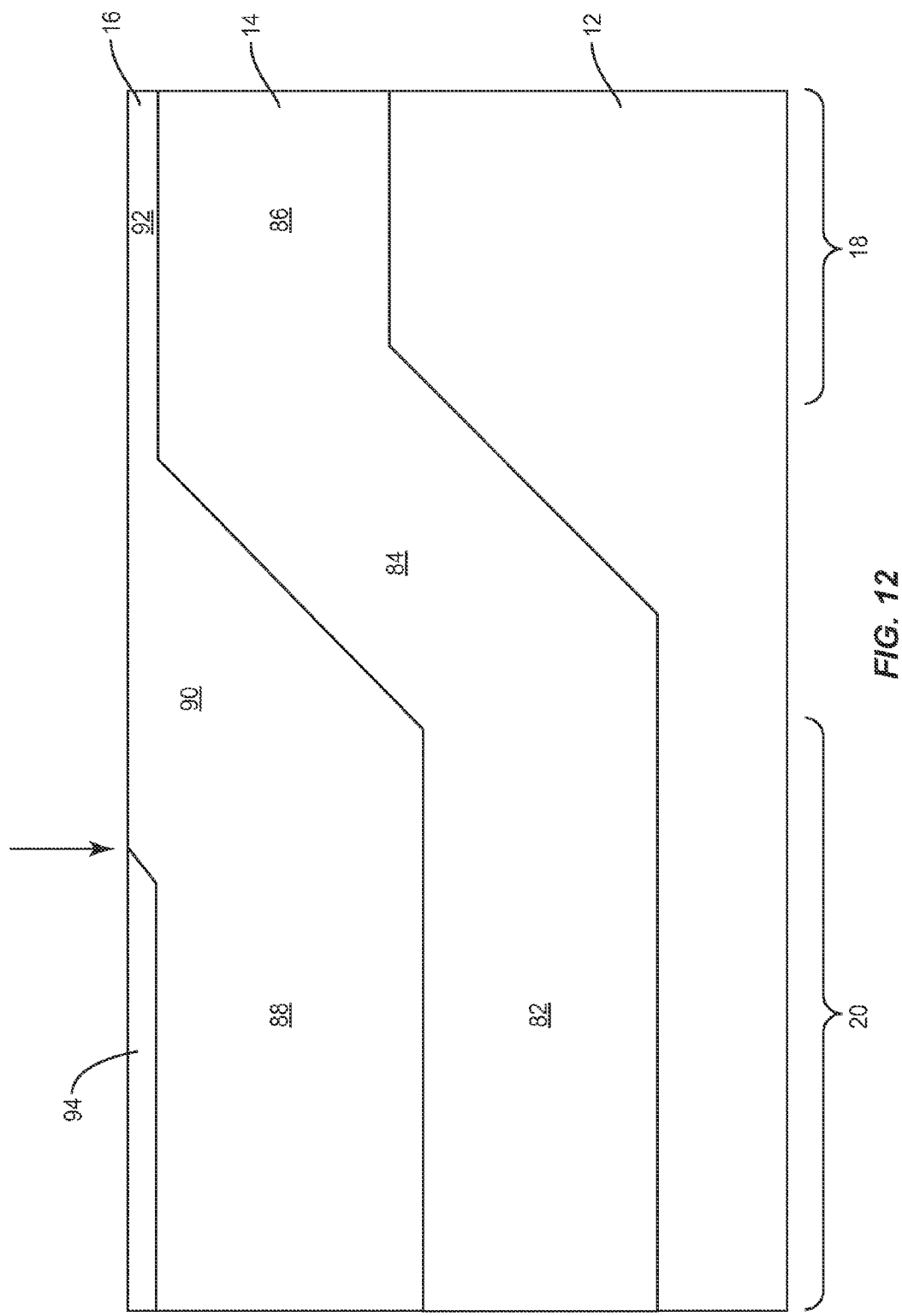
Figure 13:
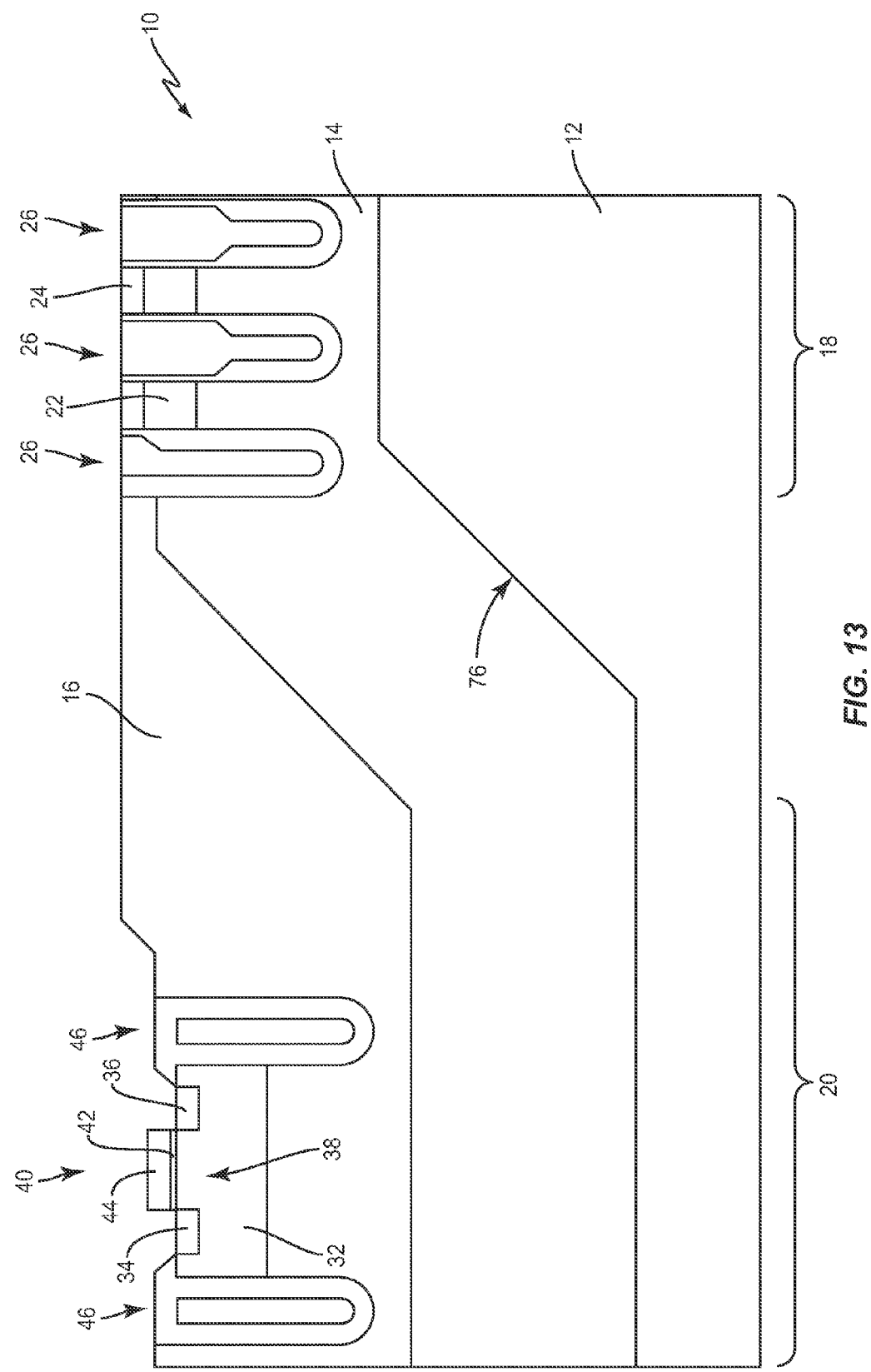

A mask layer 94 such as $SiO_2$ or SiN is deposited on the lower section 88 of the second epitaxial layer 16 and on a lower portion of the oblique stepped section 90 of the second epitaxial layer 16 as shown in FIG. 11. At least some of the upper section 92 and oblique stepped section 90 of the second epitaxial layer 16 is removed as shown in FIG. 12. These sections of the second epitaxial layer 16 can be removed e.g. via chemical-mechanical-polishing (CMP) or other suitable process. For CMP, the mask layer 94 is processed to form a stop layer and the CMP process is performed until the stop layer is detected. The edge of the mask layer 94 facing the first device region 18 provides an alignment reference for subsequent processing as indicated by the arrow in FIG. 12. The semiconductor devices of the first type are then formed in the first epitaxial layer 14 in the first device region 18 and the semiconductor devices of the second type are formed in the second epitaxial layer 16 over the first epitaxial layer 14 in the second device region 20 as shown in FIG. 13. In one embodiment, the semiconductor devices formed in the first device region are DMOS devices. The step 76 formed in the substrate 12 can be part of the termination for the DMOS devices, i.e. the DMOS devices can touch or even reach into the step 76.

Figure 14:
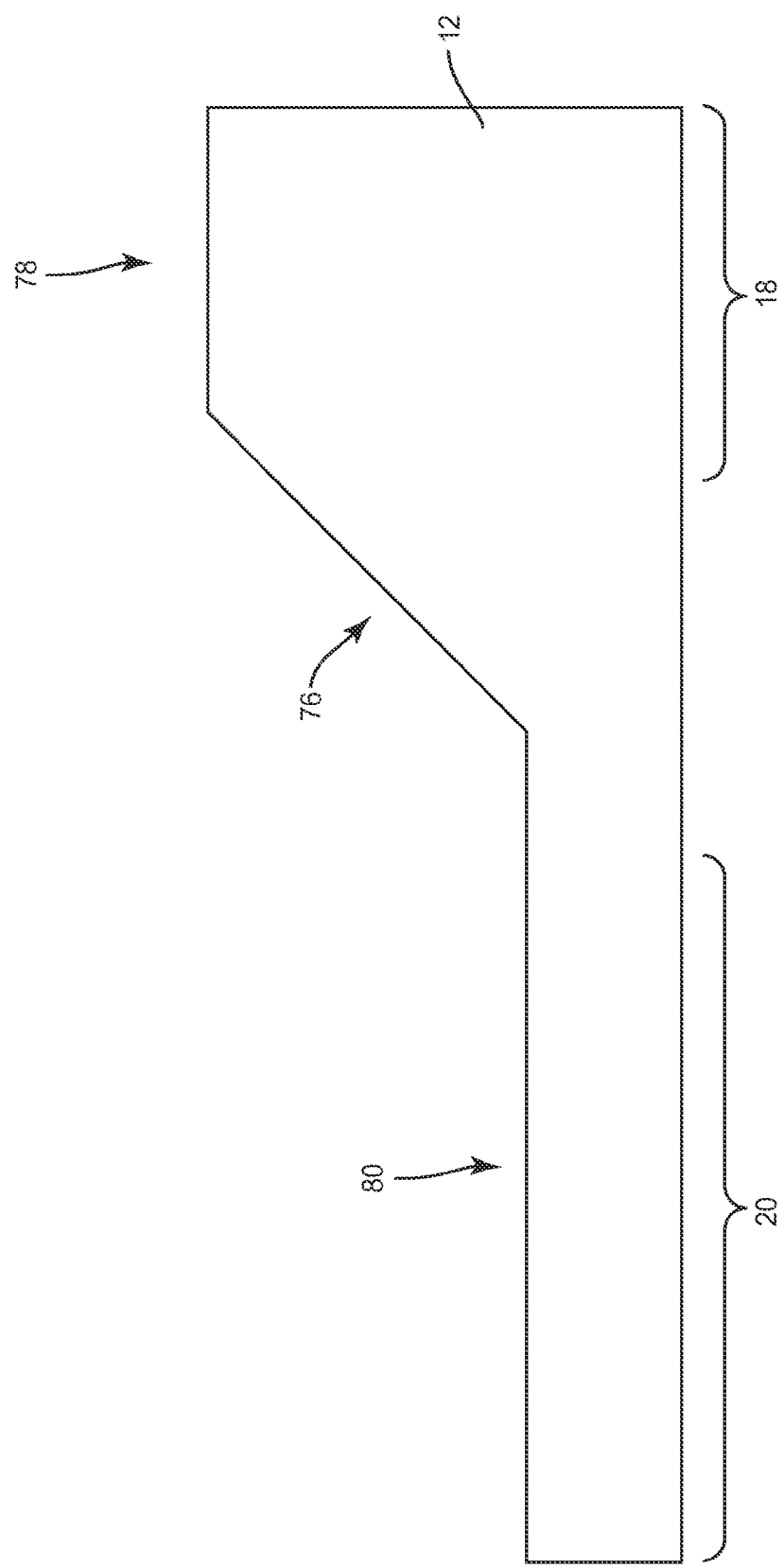
FIGS. 14-19 are schematic cross-sectional views of a semiconductor die with a first device region and a second device region integrated on the same substrate during different processing steps according to a second embodiment.
Figure 15:
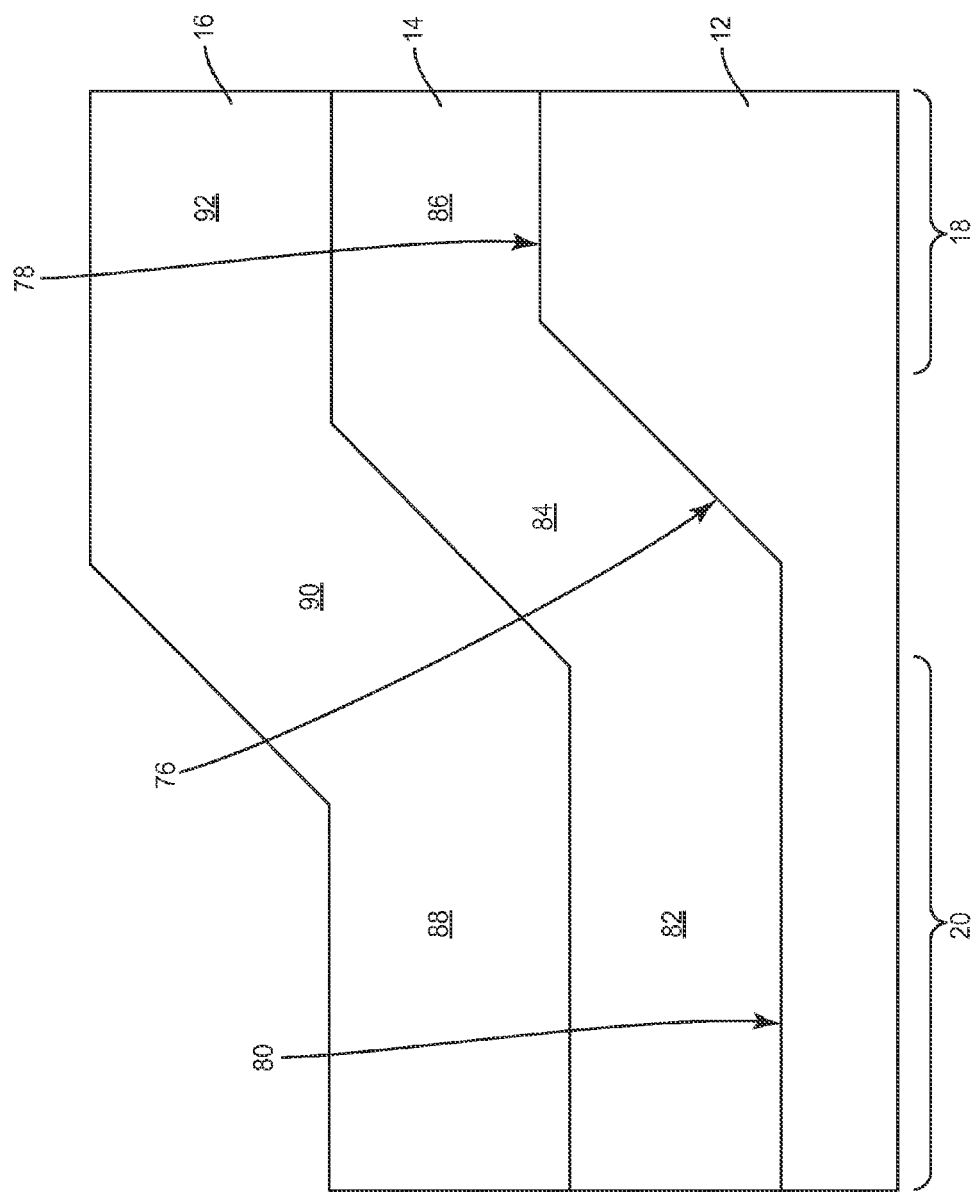

FIGS. 14-19 illustrate another embodiment of fabricating the semiconductor die 10 where the main substrate surface is structured prior to epitaxial processing. In more detail, an oblique step 76 is formed in the substrate 12 as shown in FIG. 14 so that the substrate 12 has an elevated section 78 for the first device region 18 and a recessed section 80 for the second device region 20. The first epitaxial layer 14 is grown on the elevated section 78 of the substrate 12, the recessed section 80 of the substrate 12 and the oblique step 76, and the second epitaxial layer 16 is grown on the first epitaxial layer 14 as shown in FIG. 15. The stepped contour of the substrate 12 again transfers to the first and second epitaxial layers 14, 16. That is, the first epitaxial layer 14 has a lower section 82, an oblique stepped section 84 and an upper section 86. The second epitaxial layer 16 similarly has a lower section 88, an oblique stepped section 90 and an upper section 92.

Figure 16:
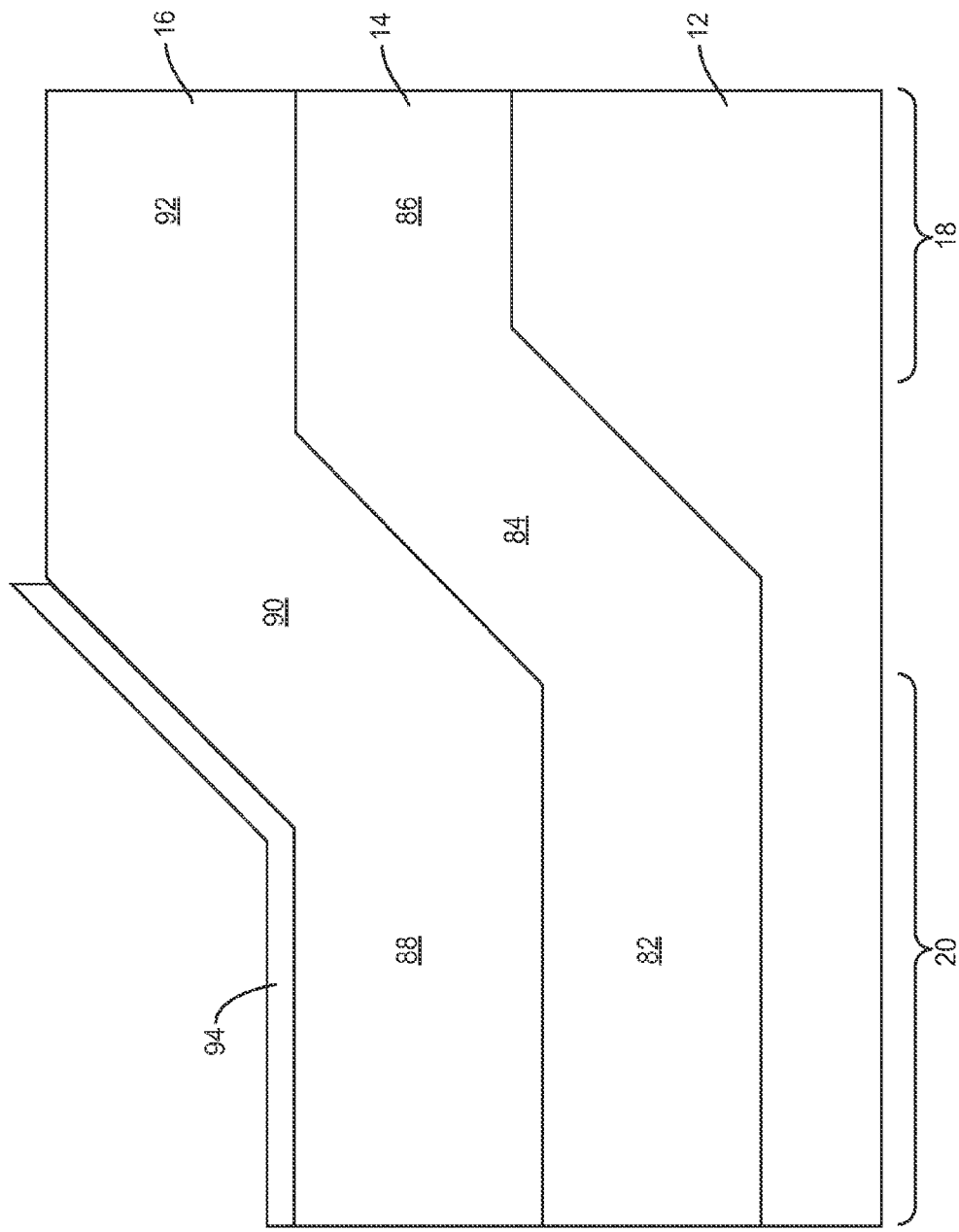
Figure 17:
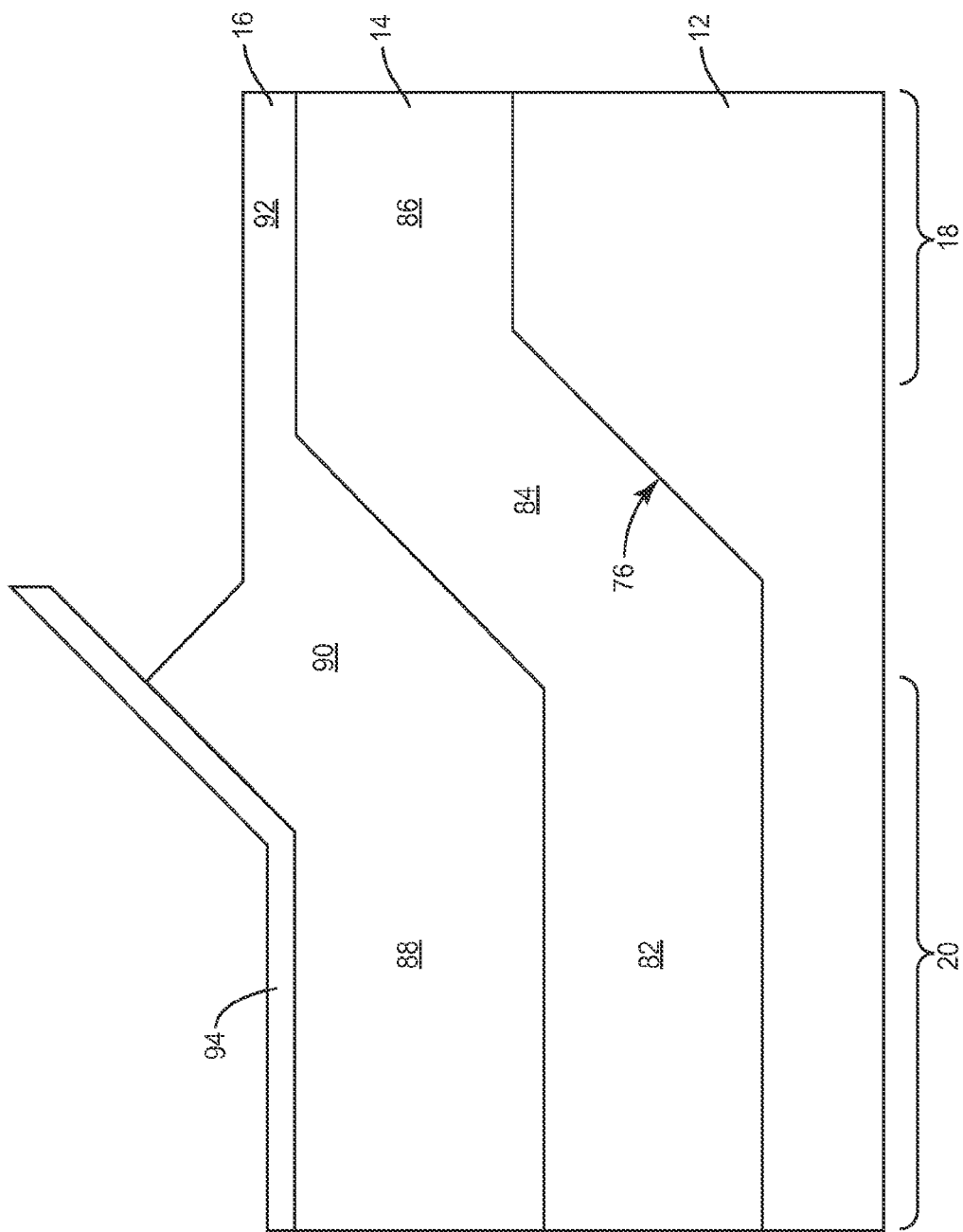
Figure 18:
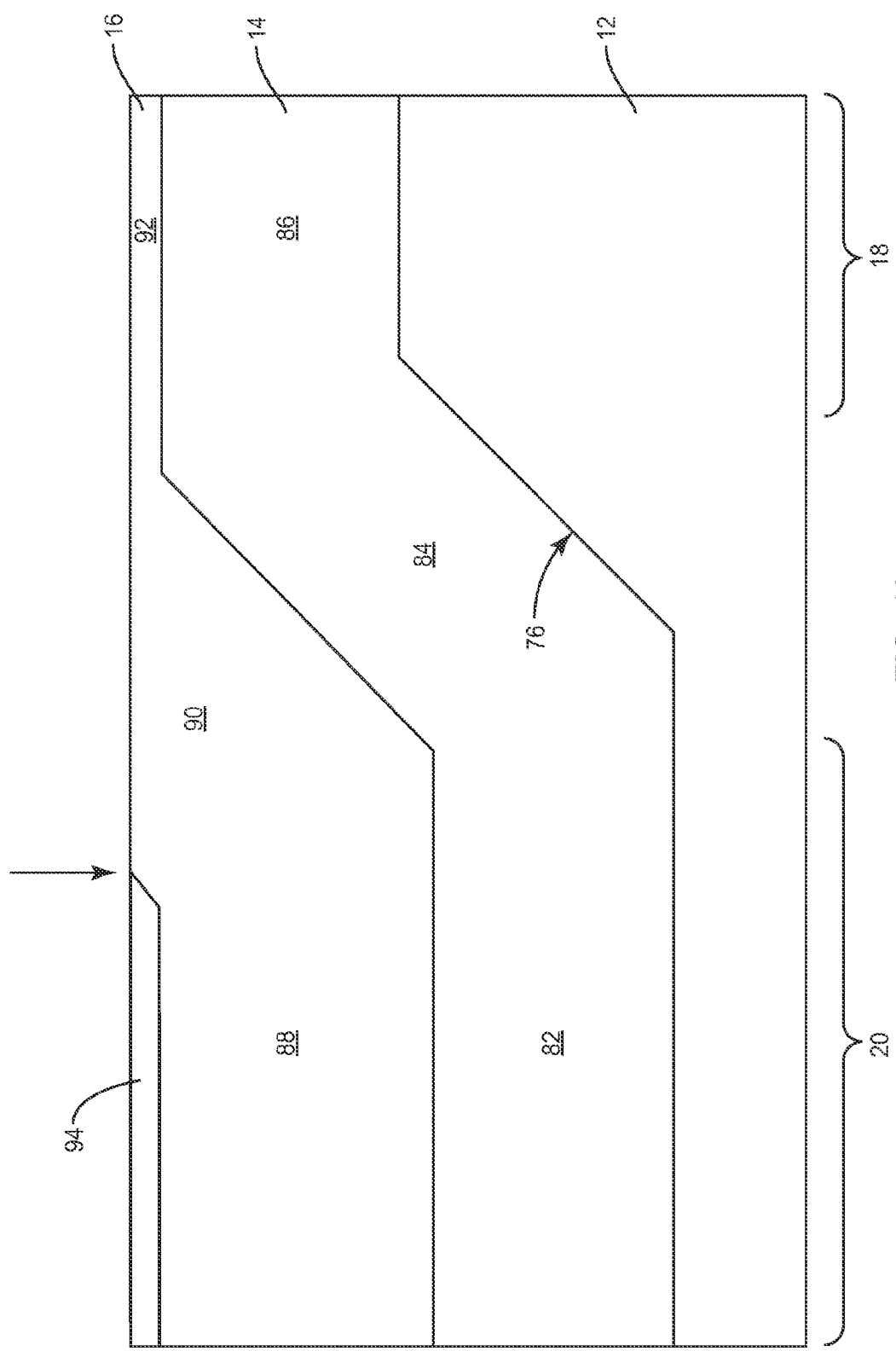
Figure 19:
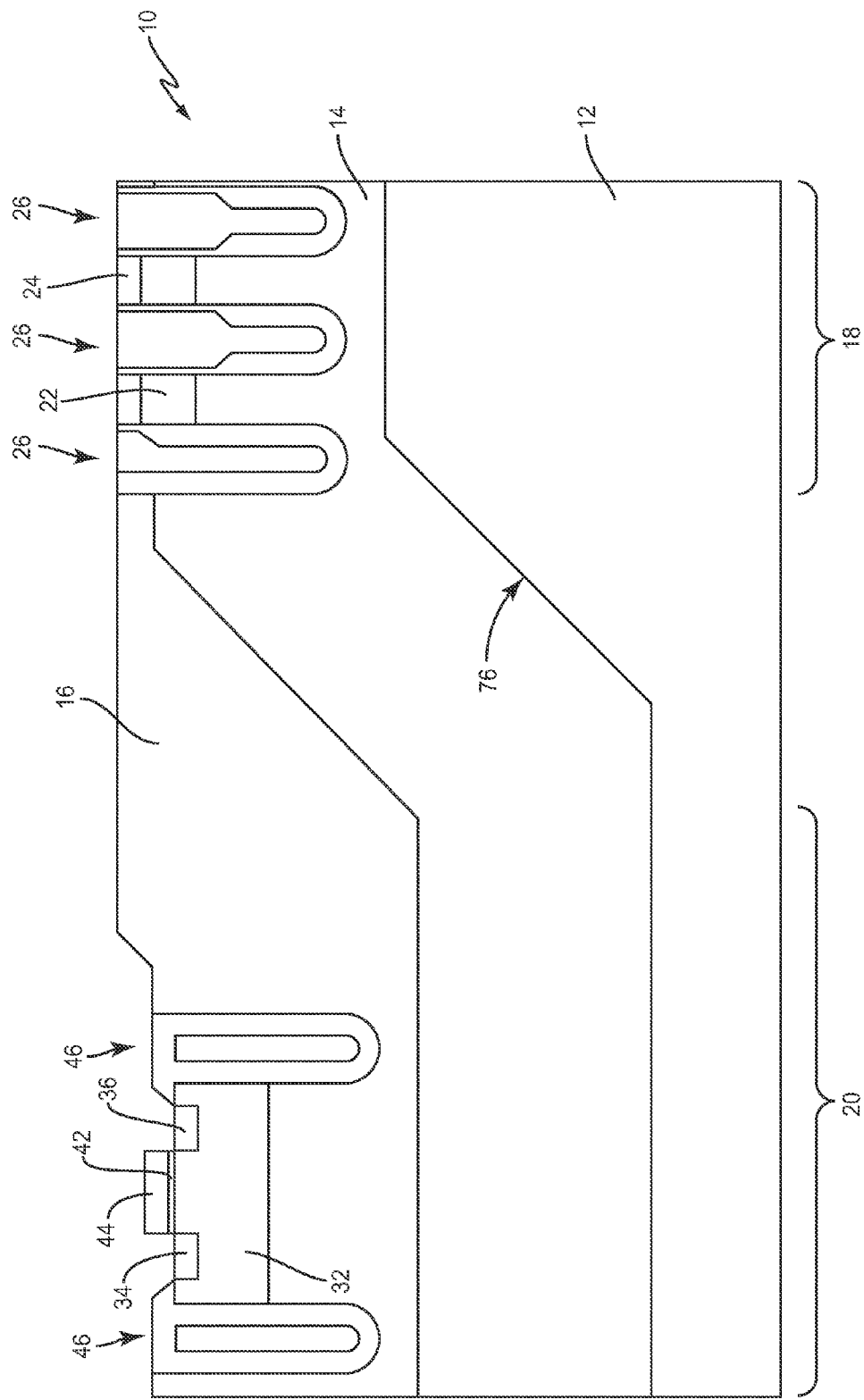

A mask layer 94 such as $SiO_2$ or SiN is deposited on the lower section 88 of the second epitaxial layer 16 and on the entire oblique sidewall 90 of the second epitaxial layer 16 as shown in FIG. 16. At least some of the upper and oblique stepped sections 92, 90 of the second epitaxial layer 16 are removed using isotropic etching as shown in FIG. 17. The mask layer 94 is structured at or near the higher edge of the step 76. CMP is then employed to remove more of the upper and oblique stepped sections 92, 90 of the second epitaxial layer 16 as shown in FIG. 18. This way, CMP is not used for removing most of the second epitaxial layer 16. Instead, most of the second epitaxial layer 16 is removed using a wet etch process with the mask layer 94 serving as an etch stop. CMP can be used to planarize the structure. The remaining edge of the mask layer 94 facing the first device region 18 again provides an alignment reference for subsequent processing as indicated by the arrow in FIG. 18. The semiconductor devices of the first type are then formed in the first epitaxial layer 14 in the first device region 18 and the semiconductor devices of the second type are formed in the second epitaxial layer 16 over the first epitaxial layer 14 in the second device region 20 as shown in FIG. 19. The semiconductor devices formed in the first device region 18 can be DMOS devices. The step 76 formed in the substrate 12 can be part of the edge termination for the DMOS devices, i.e. the DMOS devices can touch or even reach into the step 76.

FIGS. 20A-20C illustrate an embodiment of a selective epitaxial process for fabricating the semiconductor die 10. The first epitaxial layer 14 is grown on the substrate 12 as shown in FIG. 20A. The substrate 12 is then etched back in the second device region 20 prior to growing the second epitaxial layer 16 as shown in FIG. 20B. The second epitaxial layer 16 is subsequently grown in the resulting valley 100 while the first device region 18 is protected e.g. by a hard mask 102 which suppresses epitaxial growth in the first device region 18 as shown in FIG. 20C. As such, the second epitaxial layer 16 need not be removed from the first device region 18 in subsequent processing. This way, the epitaxial thickness (and doping) for the first device region 18 is given by the epitaxial process itself and not by a subsequent structuring step. The substrate 12 is covered by the first epitaxial layer 14 in first device region 18 and by the second epitaxial layer 16 in the second device region 20. As such, the second epitaxial layer 16 is laterally adjacent the first epitaxial layer 14. In one embodiment, the first device region 18 includes DMOS devices (not shown in FIGS. 20A-20C) and the second device region 20 includes CMOS devices (also not shown in FIGS. 20A-20C). The second epitaxial layer 16 can be more lightly doped and thicker than the first epitaxial layer 14 as previously described herein to independently optimize the epitaxial properties for both types of devices.

Figure 21:
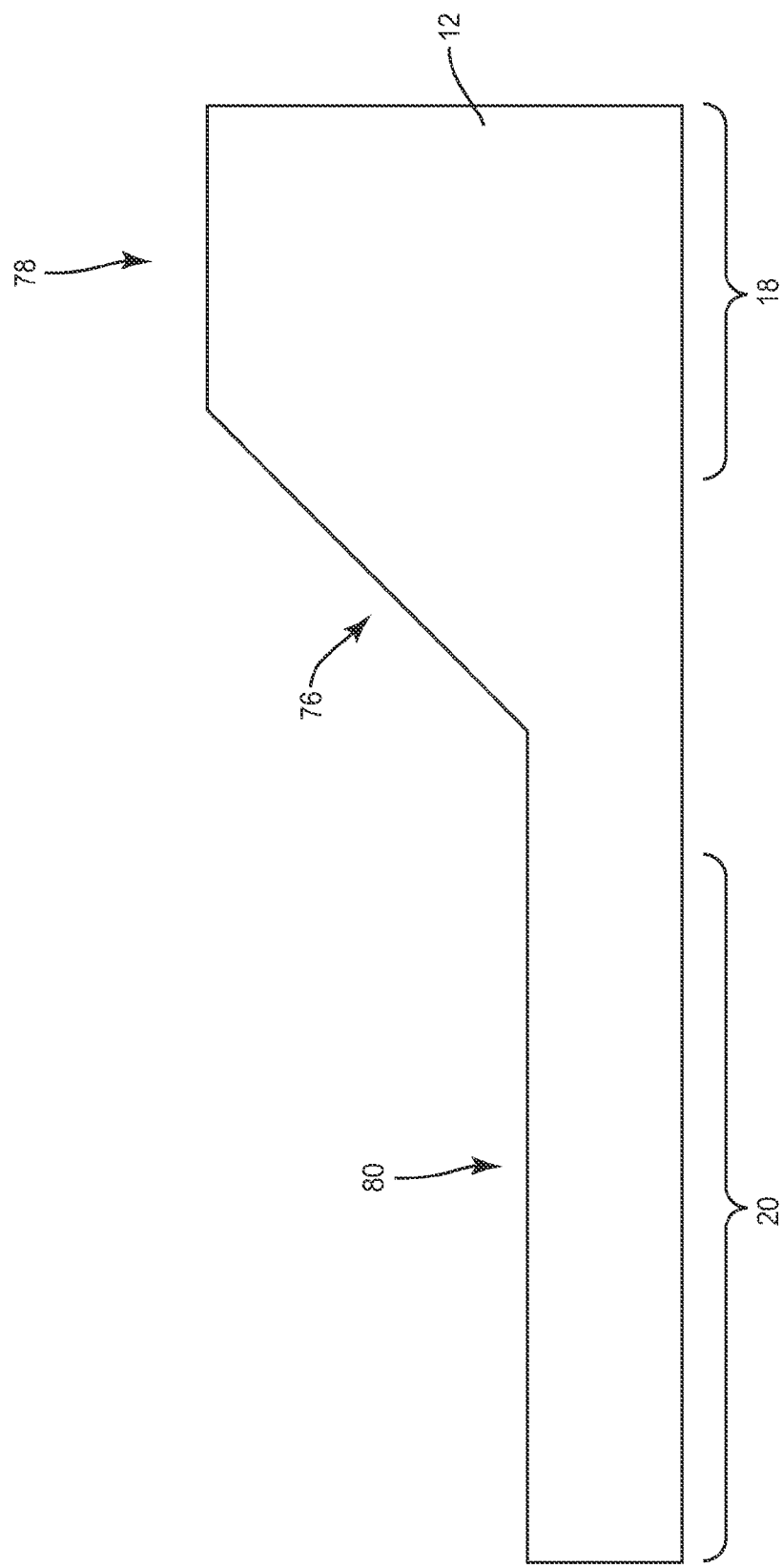
FIGS. 21-25 are schematic cross-sectional views of a semiconductor die with a first device region and a second device region integrated on the same substrate during different processing steps according to still a fourth embodiment.
Figure 22:
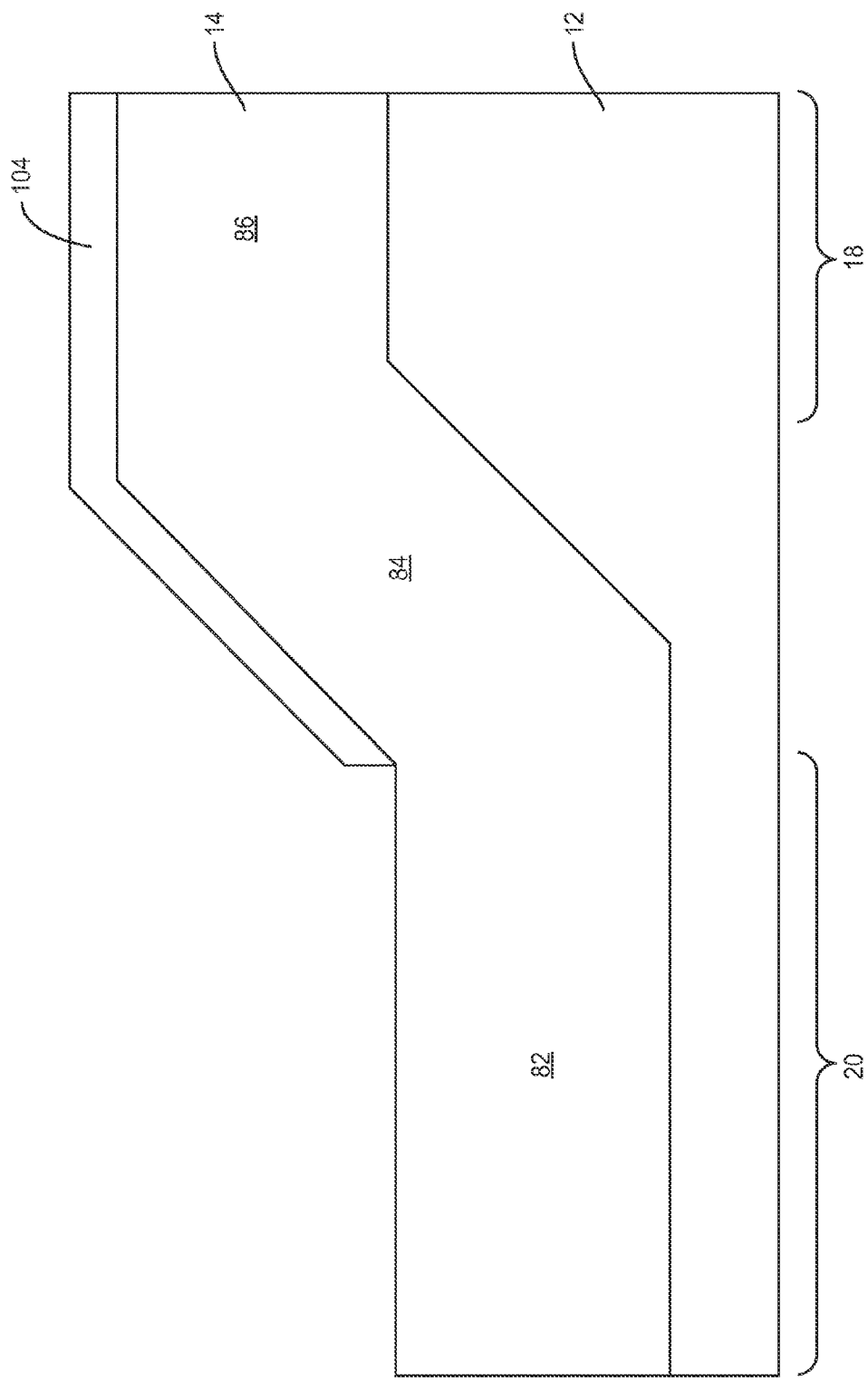
Figure 23:
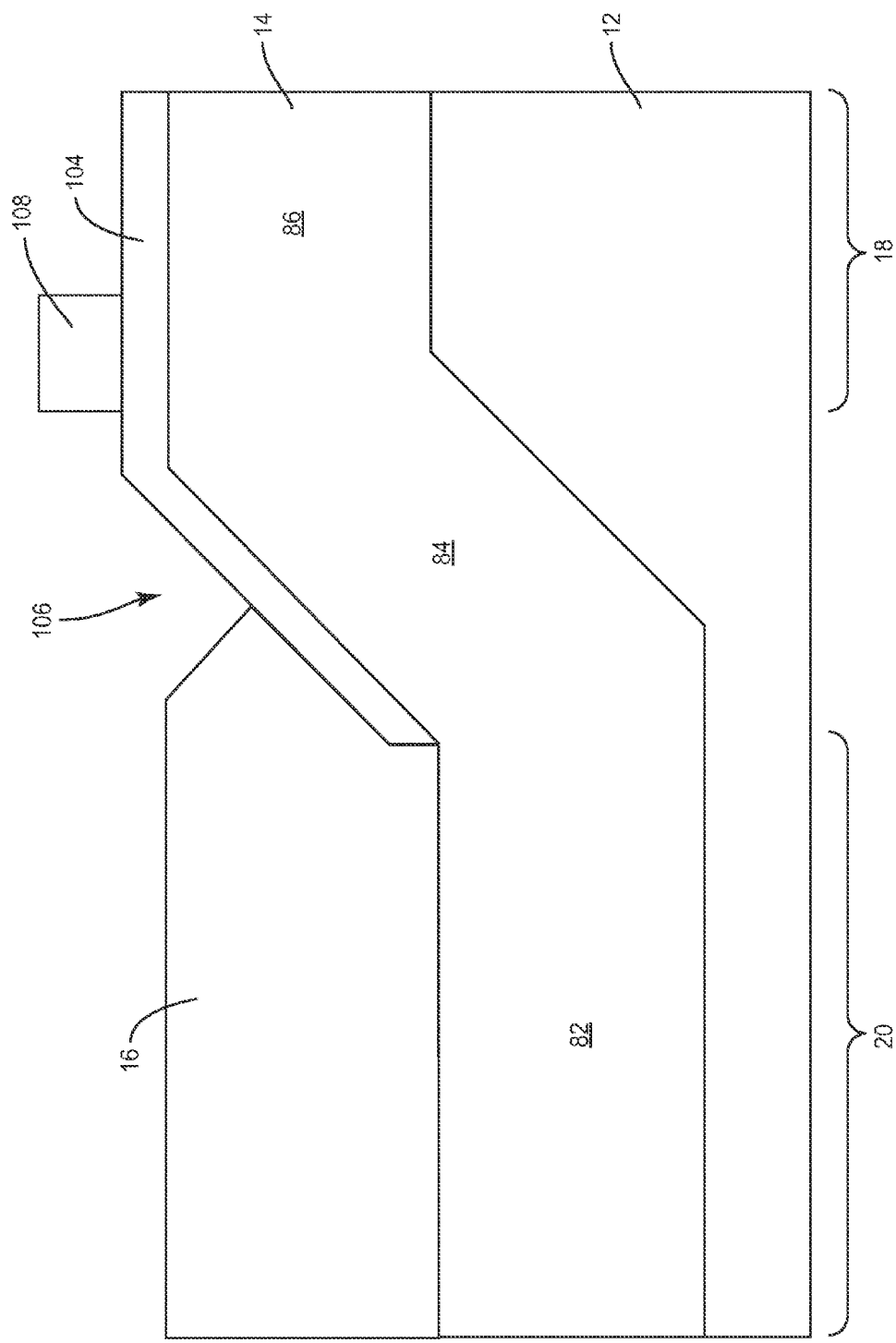
Figure 24:
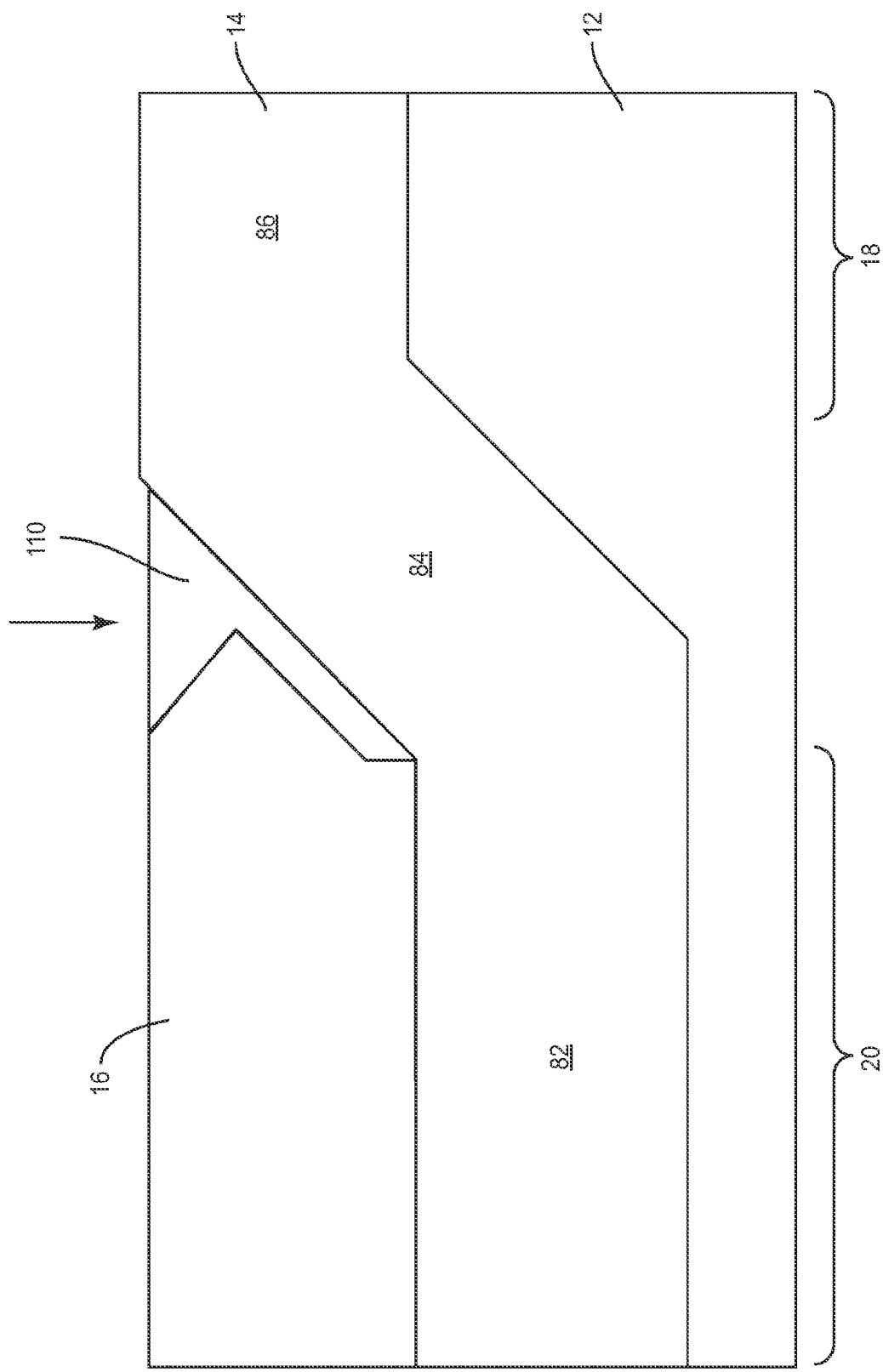
Figure 25:
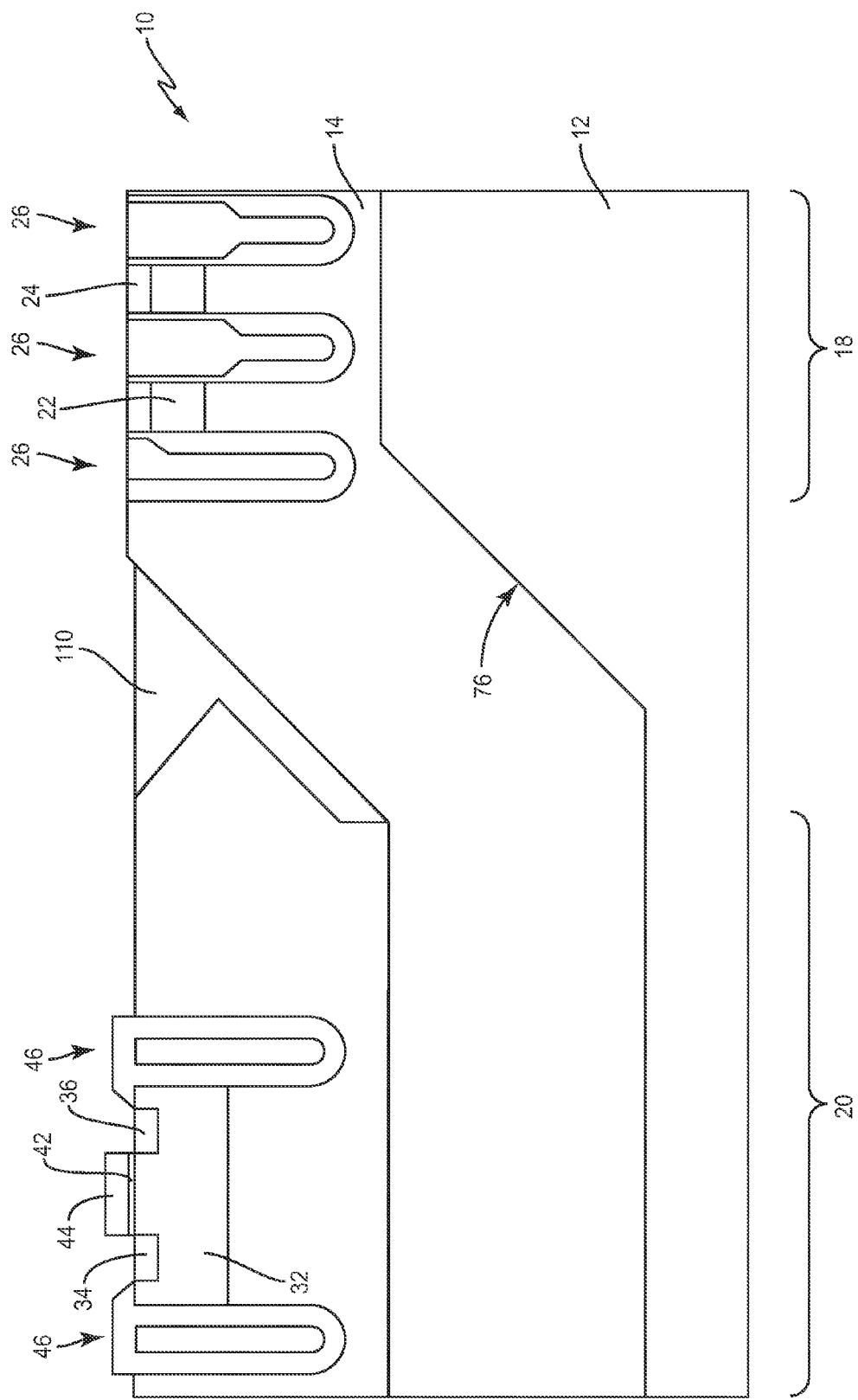

FIGS. 21-25 illustrate an embodiment of a selective epitaxial process for fabricating the semiconductor die 10. According to this embodiment, the substrate 12 is structured prior to epitaxial processing and hard mask formation. In more detail, an oblique step 76 is formed in the substrate 12 so that the substrate 12 has an elevated section 78 for the first device region 18 and a recessed section 80 for the second device region 20 as shown in FIG. 21. The first epitaxial layer 14 is then grown on the substrate 12 so that the first epitaxial layer 14 has a lower section 82, an oblique stepped section 84 and an upper section 86, and a mask layer 104 such as $SiO_2$ or SiN is deposited on the upper and oblique stepped sections 84, 86 of the first epitaxial layer 14 as shown in FIG. 22. The edge of the mask layer 104 is located at or close to the bottom edge of the oblique stepped section 84 of the first epitaxial layer 14 according to this embodiment. Accordingly, little or no topography above the plateau level builds up during the formation of the second epitaxial layer 16 which is grown on the first epitaxial layer 14 as shown in FIG. 23. A divot 106 remains close to the top edge of the plateau after growth of the second epitaxial layer 16. The divot 106 can be filled to avoid integration problems in subsequent process steps. Also, an additional cleaning and planarization step can be performed to remove silicon artifacts 108 which may have been deposited on top of the mask layer 104 during the second epitaxial formation step and to align the surface of the first device region 18 to the second device region 20. The divot fill material 110 can be used as an alignment reference as indicated by the arrow in FIG. 24 for subsequent processing. The semiconductor devices of the first type are then formed in the first epitaxial layer 14 in the first device region 18 and the semiconductor devices of the second type are formed in the second epitaxial layer 16 over the first epitaxial layer 14 in the second device region 20 as shown in FIG. 25.

Figure 26:
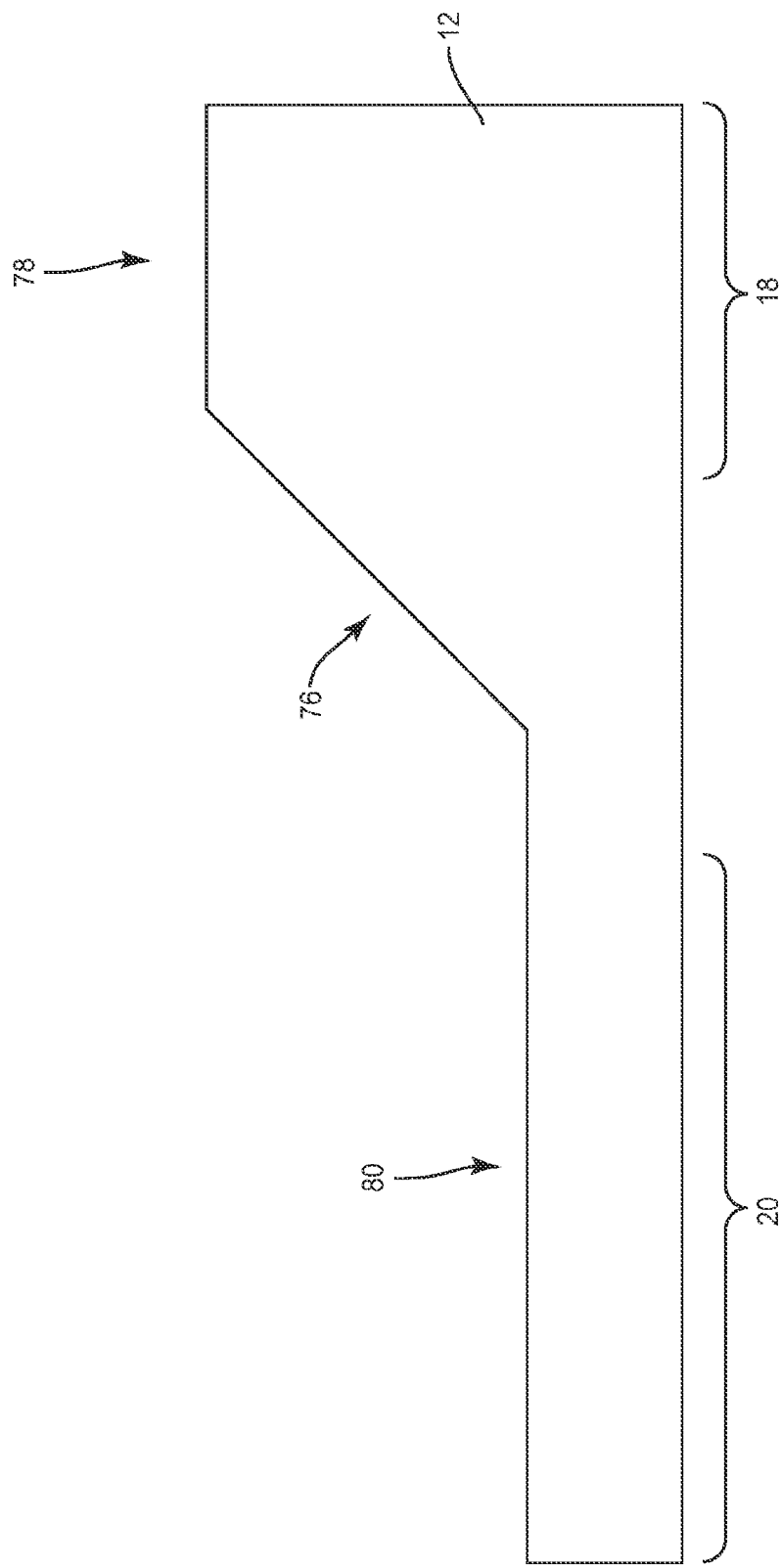
FIGS. 26-30 are schematic cross-sectional views of a semiconductor die with a first device region and a second device region integrated on the same substrate during different processing steps according to a fifth embodiment.
Figure 27:
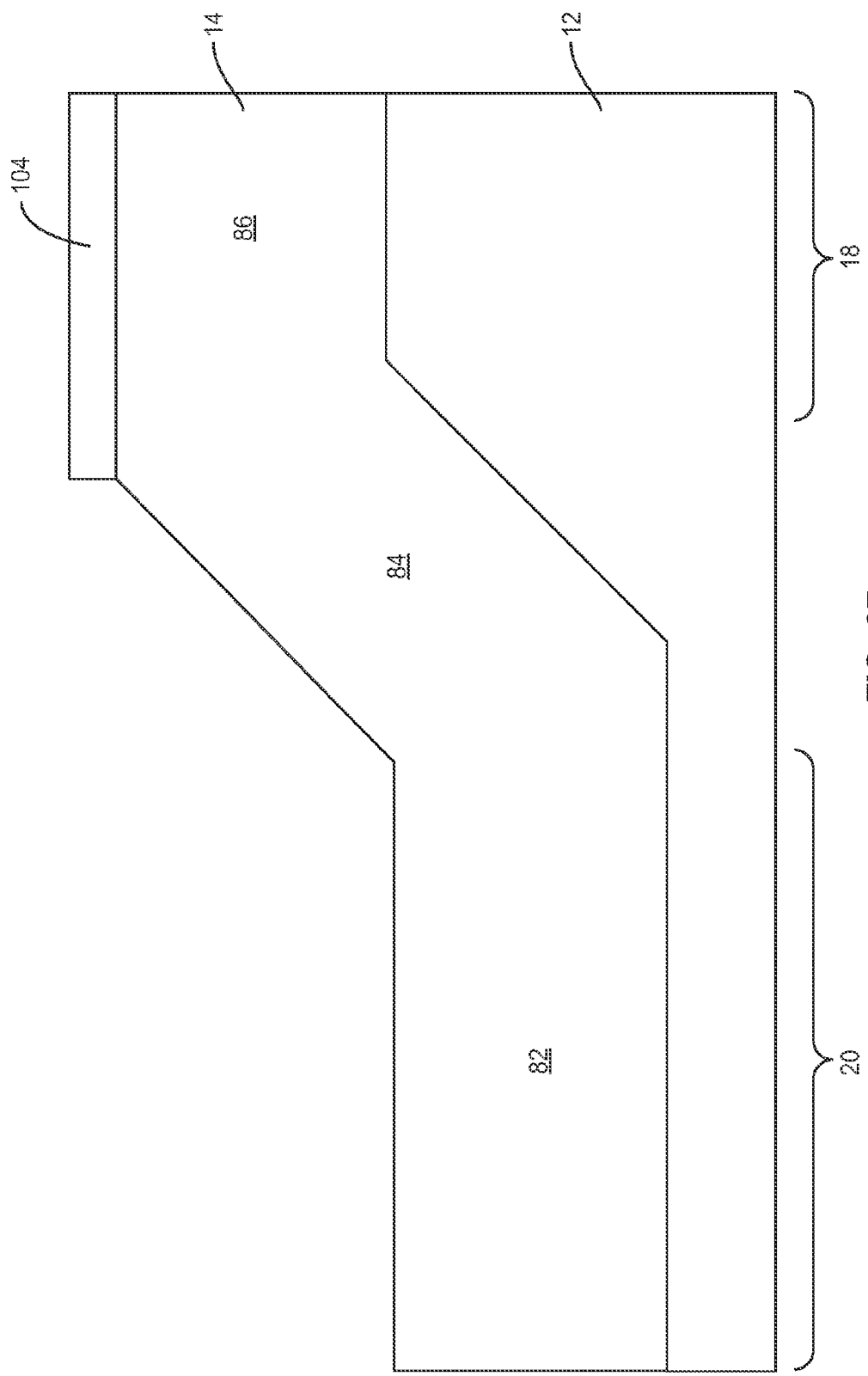
Figure 28:
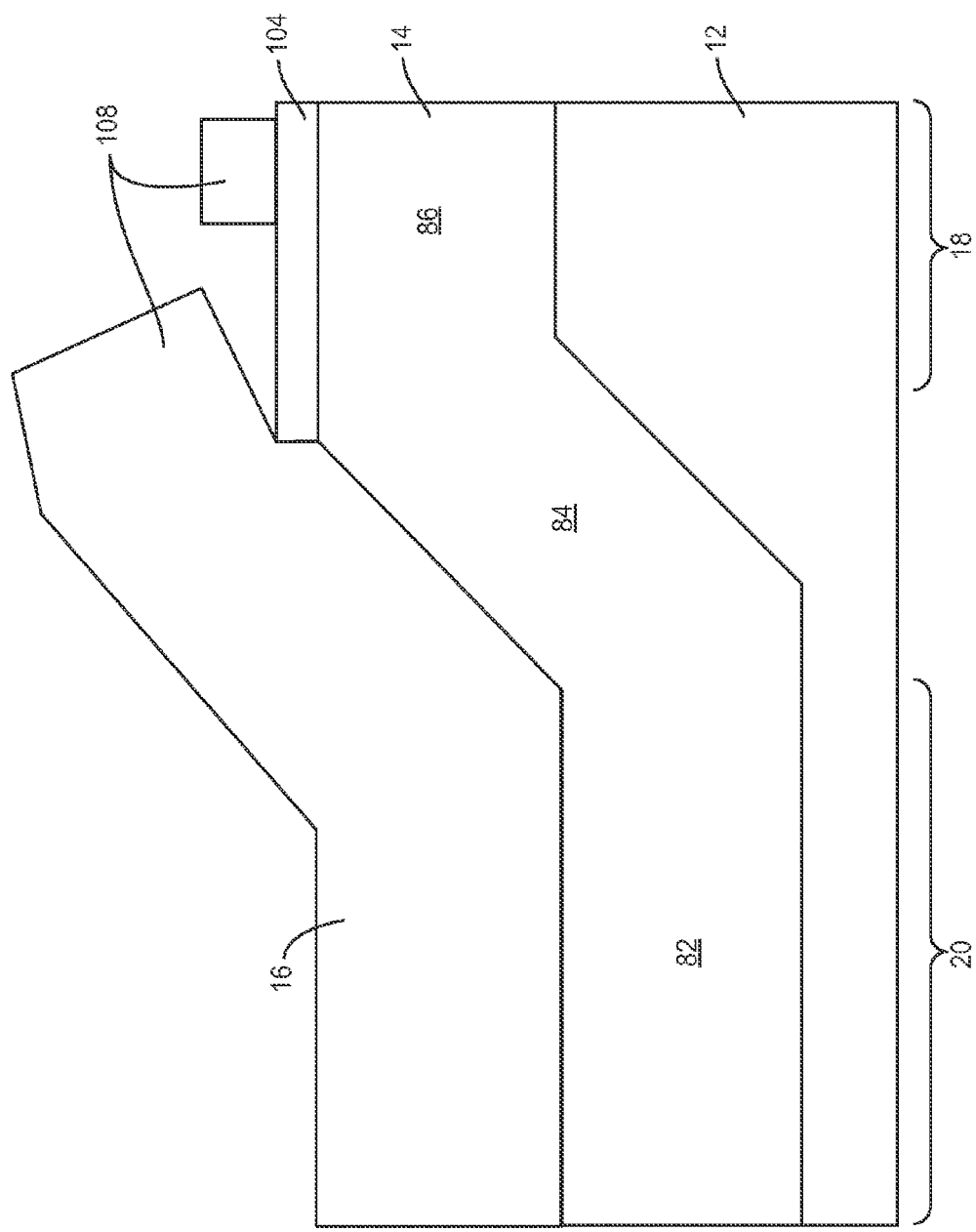
Figure 29:
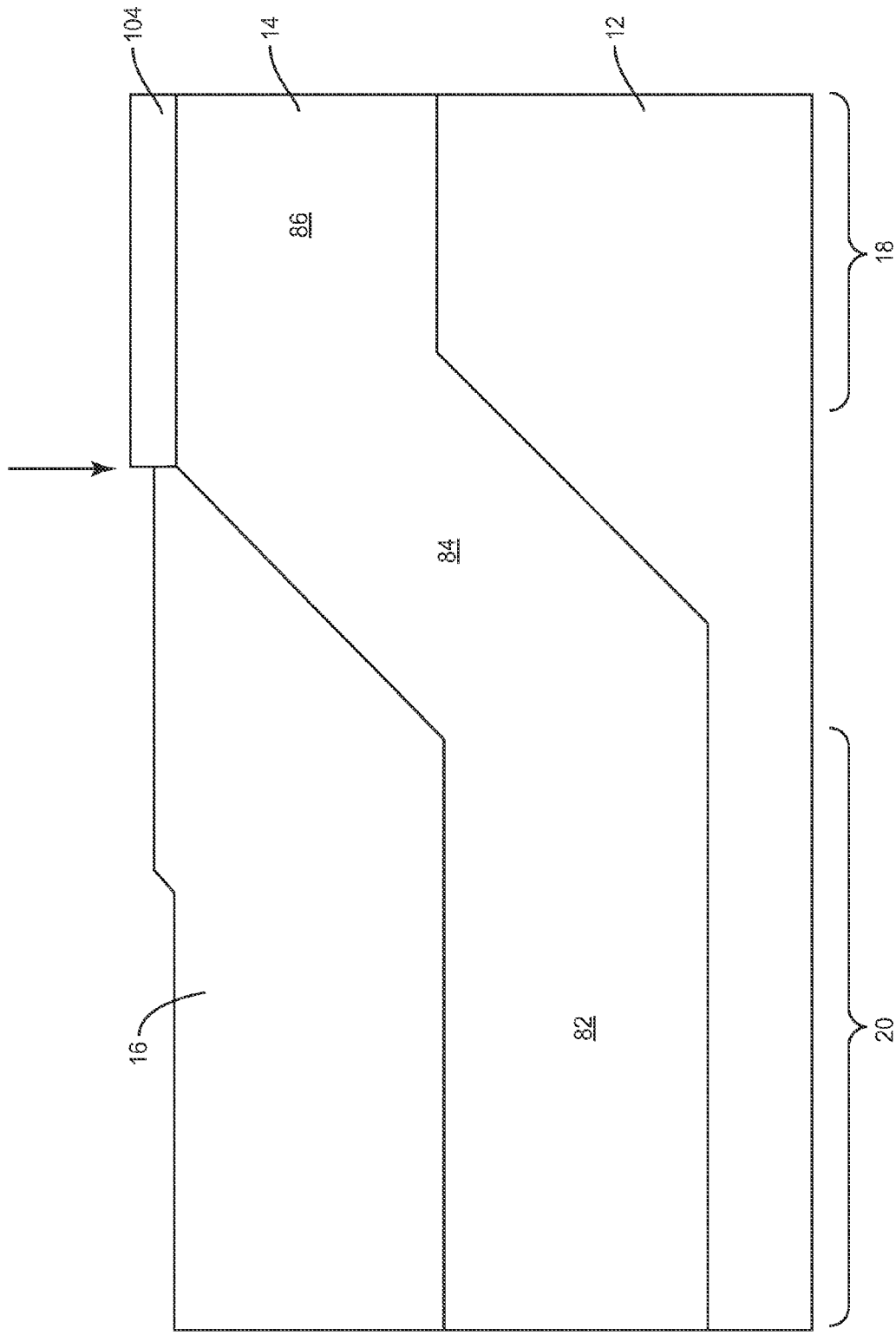
Figure 30:
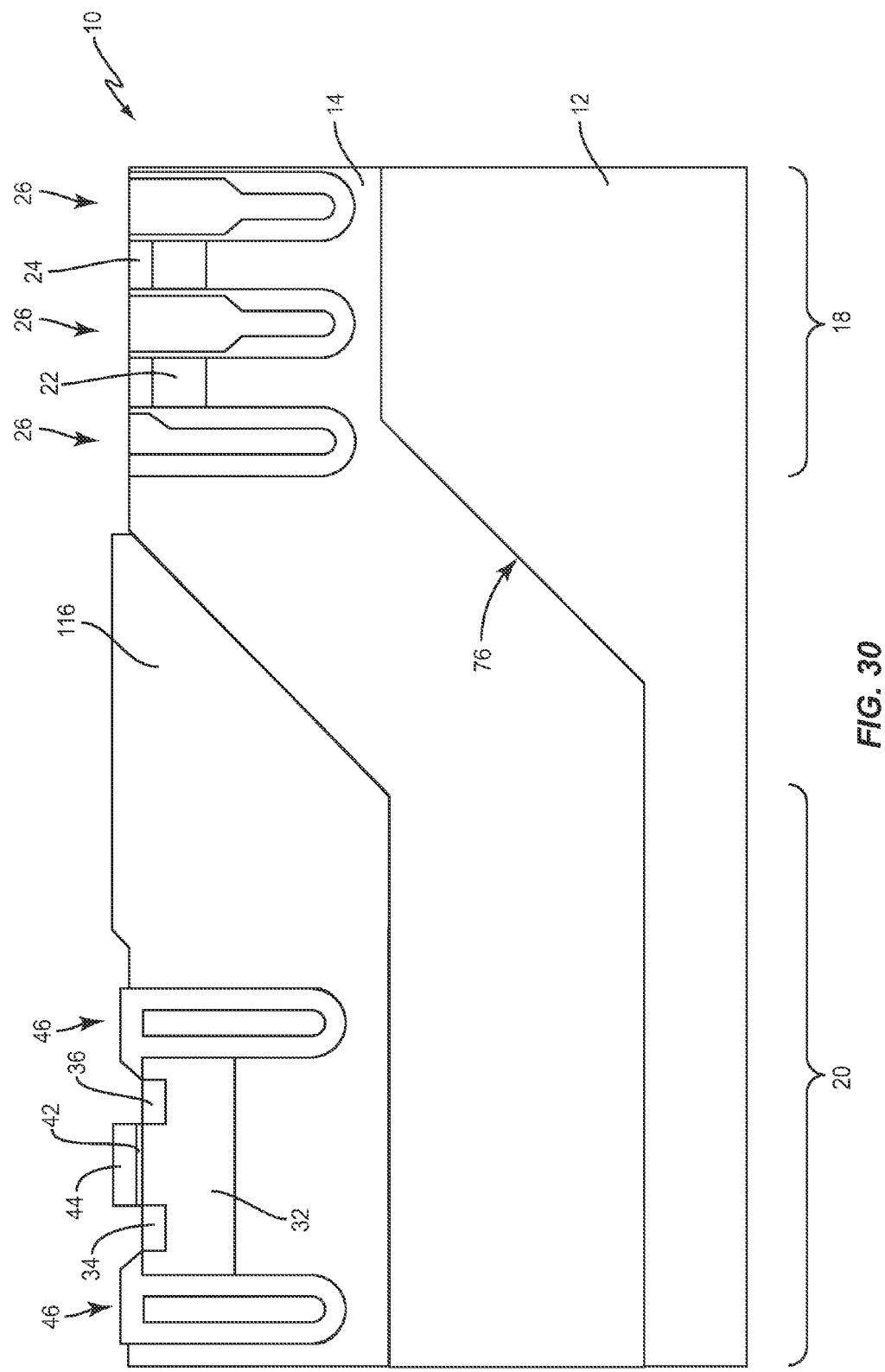

FIGS. 26-30 illustrate another embodiment of a selective epitaxial process for fabricating the semiconductor die 10. According to this embodiment, an oblique step 76 is formed in the substrate 12 so that the substrate 12 has an elevated section 78 for the first device region 18 and a recessed section 80 for the second device region 20 as shown in FIG. 26. The first epitaxial layer 14 is grown on the substrate 12 so that the first epitaxial layer 14 has a lower section 82, an oblique stepped section 84 and an upper section 86, and a mask layer 104 is deposited on the upper section 86 of the first epitaxial layer 14 as shown in FIG. 27. The second epitaxial layer 16 is grown on the lower and oblique stepped sections 82, 84 of the first epitaxial layer 14 as shown in FIG. 28. The selective epitaxial may grow above the top of the plateau in the edge region, resulting in artifacts 108. A CMP is performed to remove the silicon artifacts 108 as shown in FIG. 29. No divots are present in the upper surface and thus no fill step is performed. The semiconductor devices of the first type are formed in the first epitaxial layer 14 in the first device region 18 and the semiconductor devices of the second type are formed in the second epitaxial layer 16 over the first epitaxial layer 14 in the second device region 20 as shown in FIG. 30.

Figure 31:
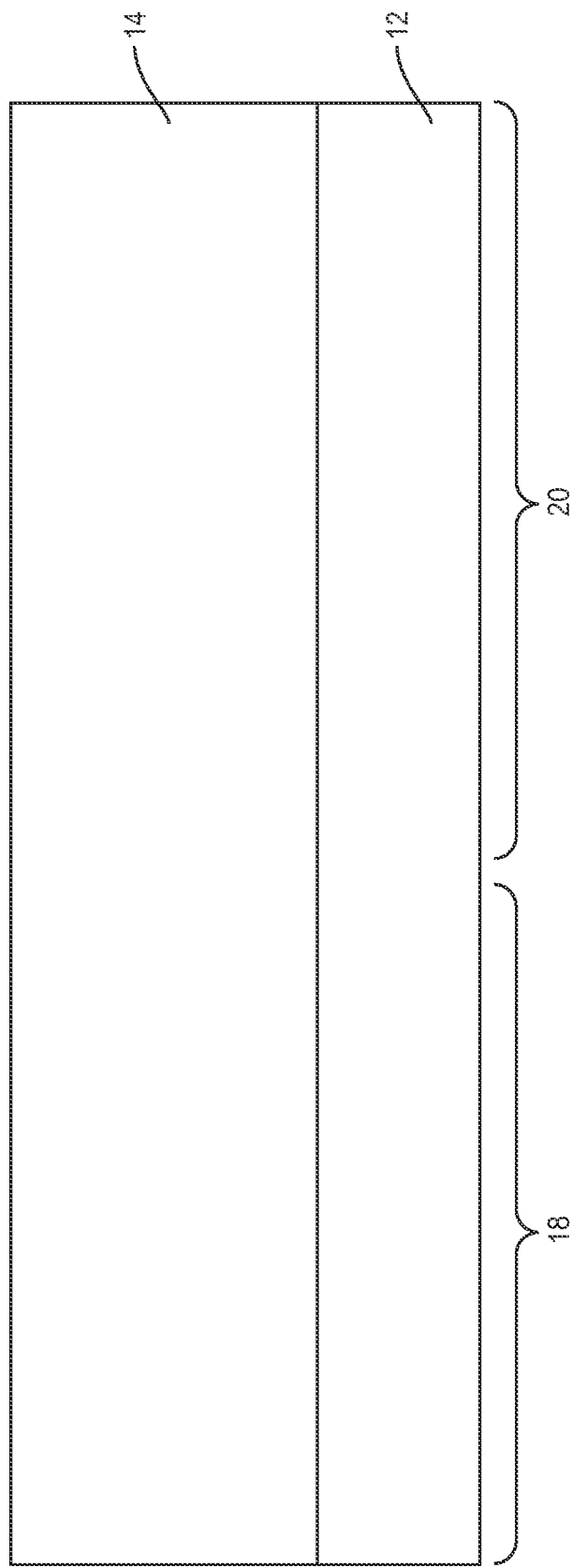
FIGS. 31-36 are schematic cross-sectional views of a semiconductor die with a first device region and a second device region integrated on the same substrate during different processing steps according to a sixth embodiment.
Figure 32:
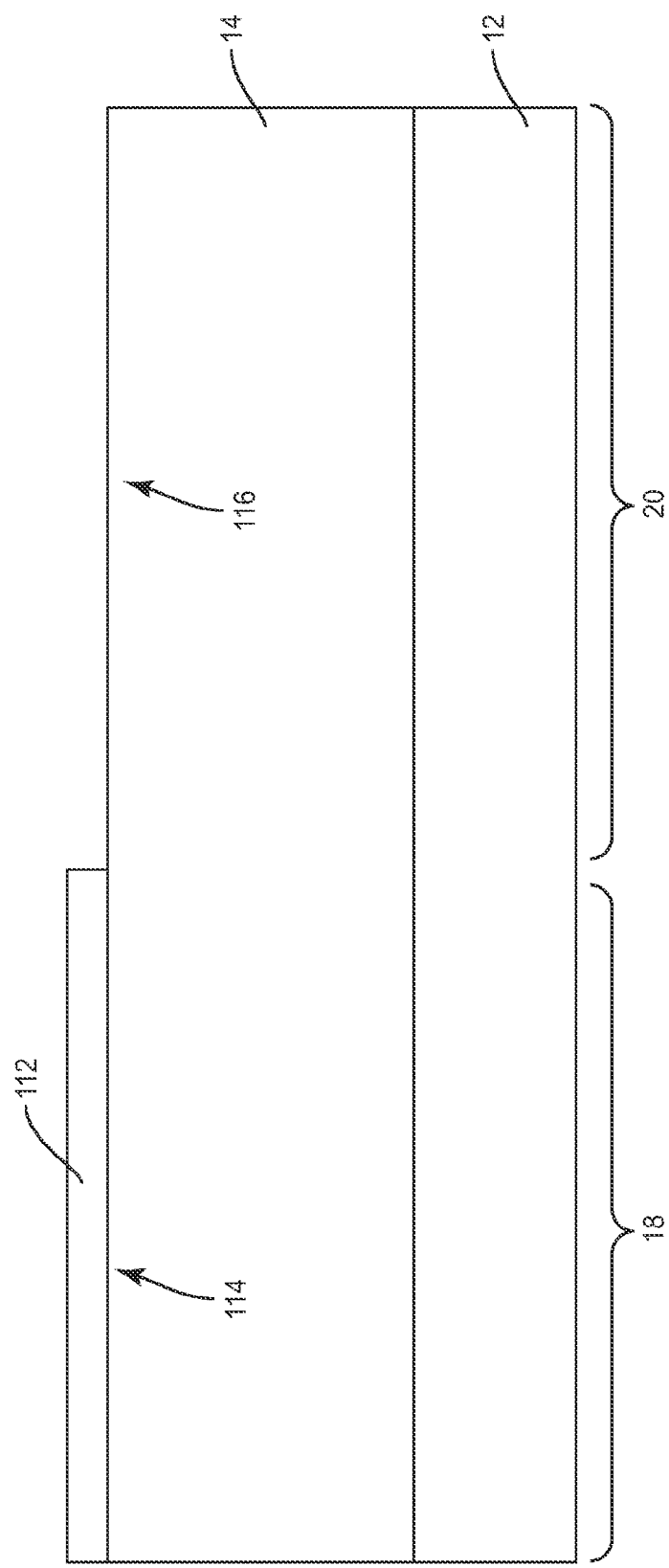
Figure 33:
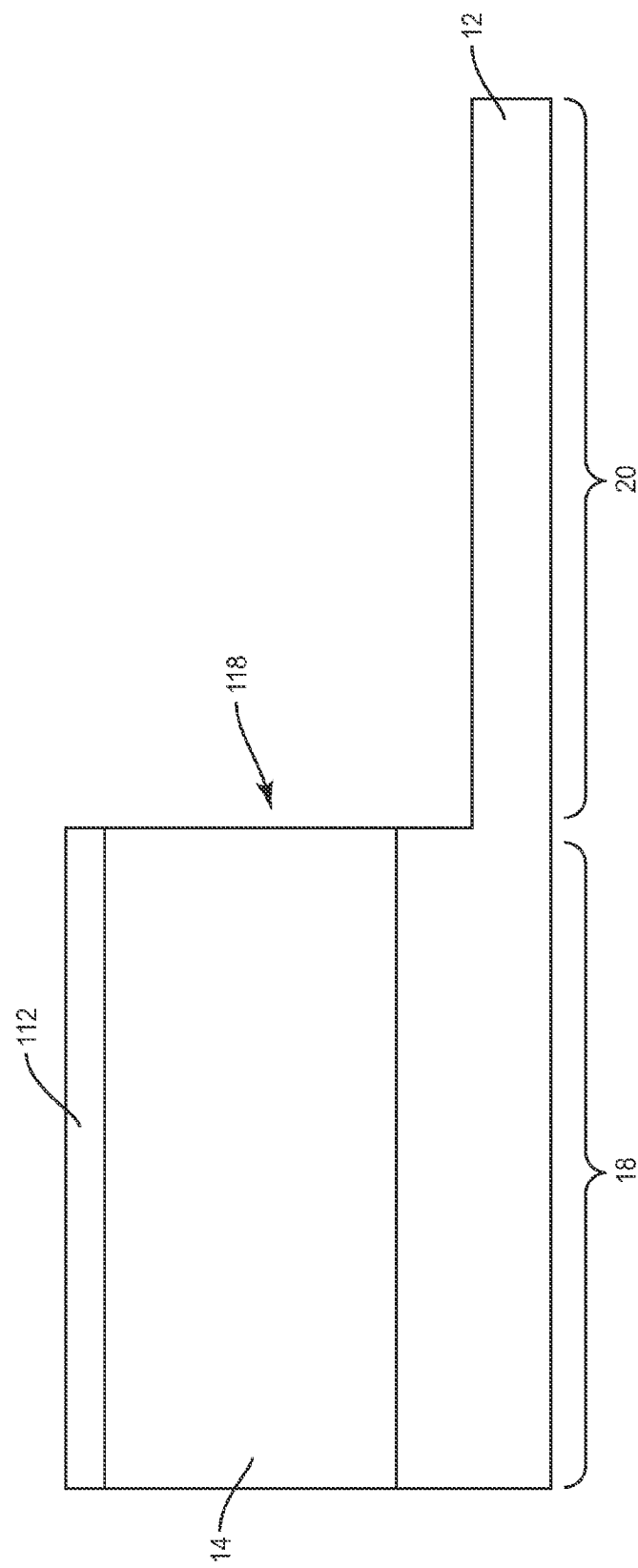
Figure 34:
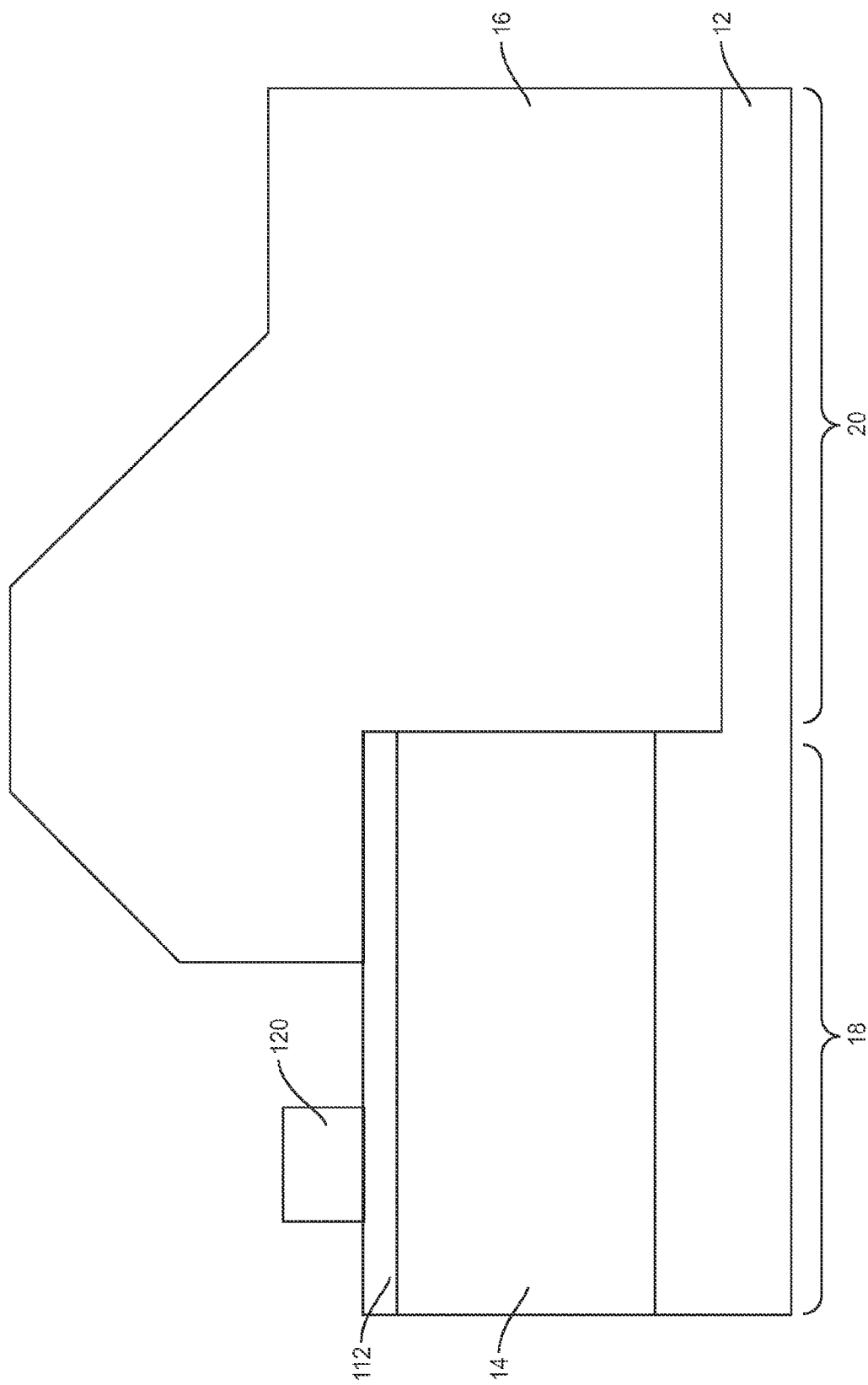
Figure 35:
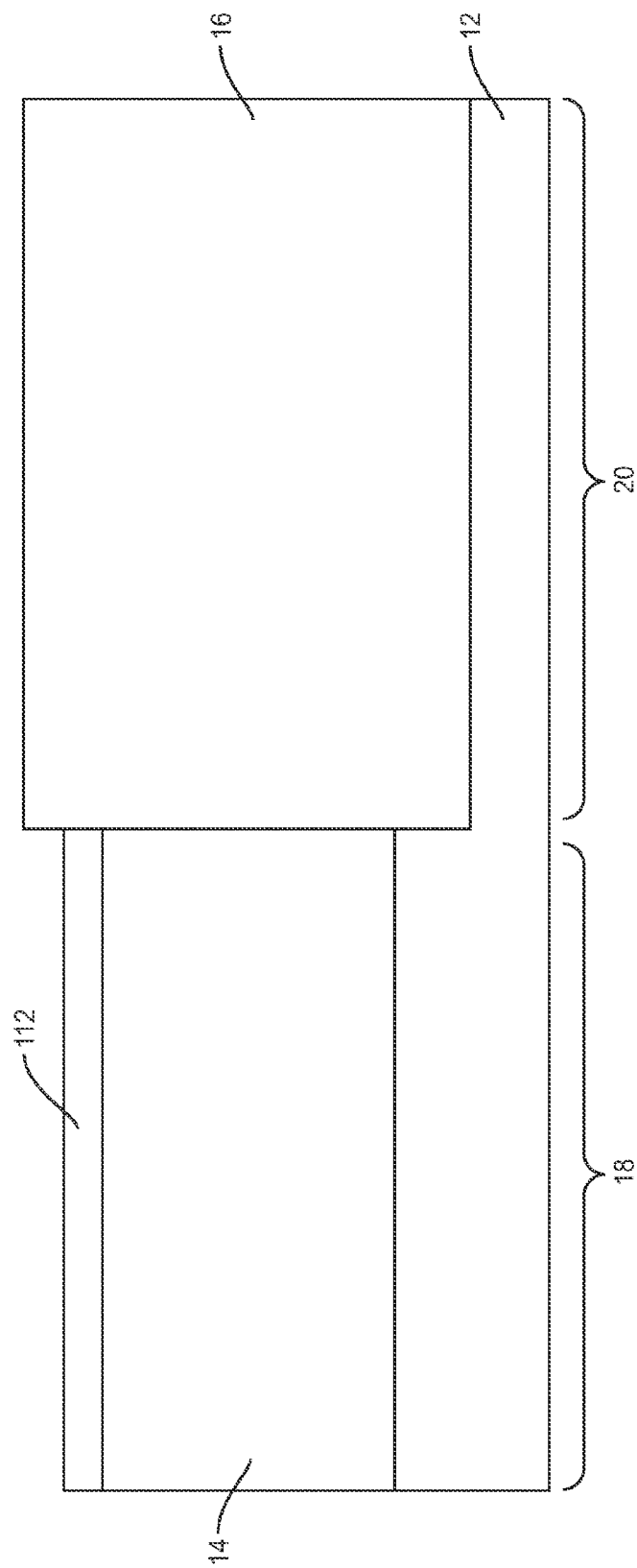
Figure 36:
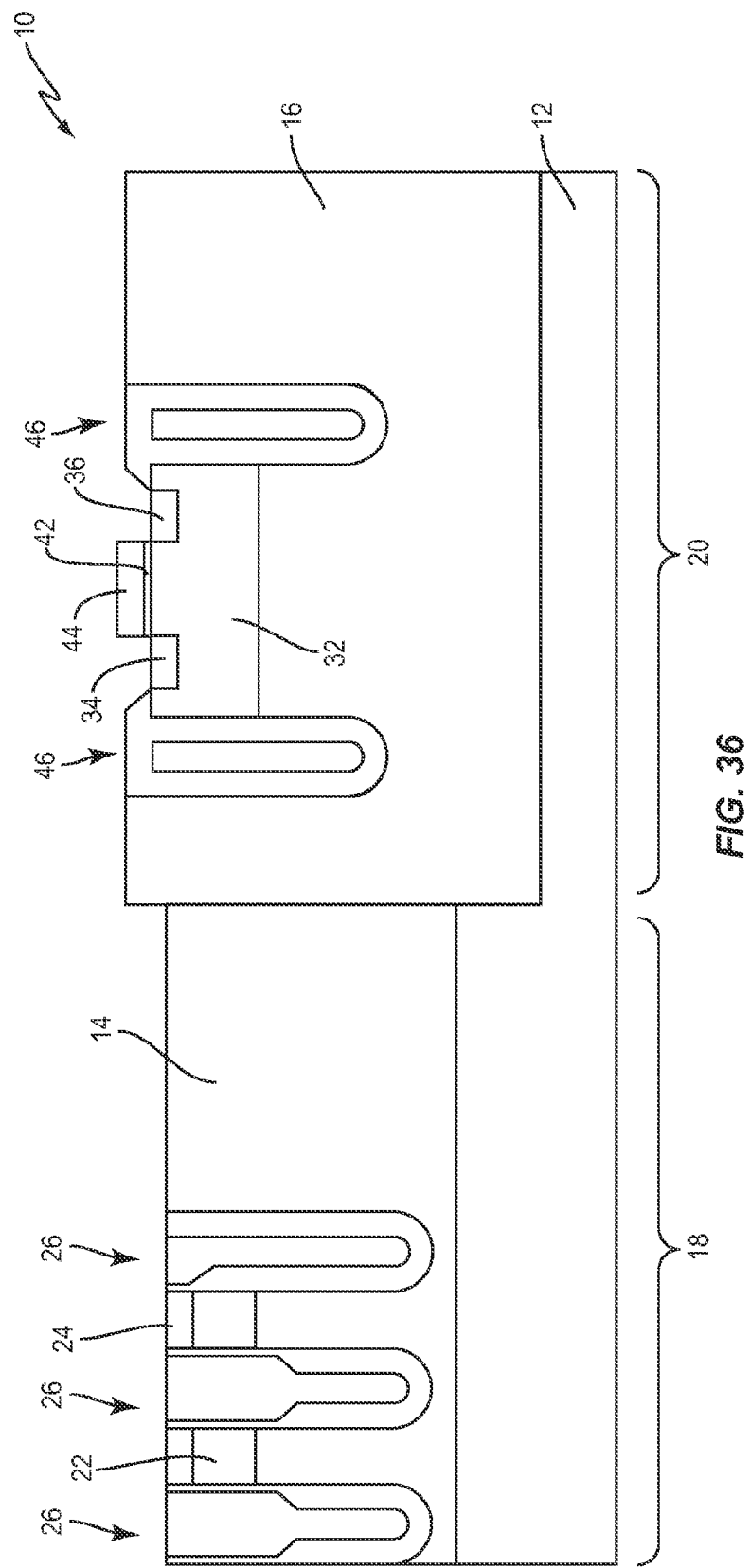

FIGS. 31-36 illustrate yet another embodiment of a selective epitaxial process for fabricating the semiconductor die 10. The semiconductor substrate 12 is structured after formation of the first epitaxial layer 14 and mask layer 112, but prior to formation of the second epitaxial layer 16. In more detail, the first epitaxial layer 14 is grown on the substrate 12 as shown in FIG. 31. A mask layer 112 is deposited on part of the first epitaxial 14 so that the first epitaxial layer 14 has a masked portion 114 covered by the mask layer 112 in the first device region 118 and an unmasked portion 116 in the second device region 120 as shown in FIG. 32. The unmasked portion 116 of the first epitaxial layer 14 is removed e.g. via plasma etching so that the substrate 12 is exposed and etched in the second device region 20 as shown in FIG. 33. As such, the substrate 12 is structured using the same mask 112 used for the subsequent selective growth of the second epitaxial layer 16. Doing so eliminates a photo process step. In addition, the step 118 formed in the sidewall can be vertical or oblique depending on process integration considerations. The second epitaxial layer 16 is then grown over the exposed part of the substrate 12 after the upper portion of the exposed part is removed so that the second epitaxial layer 16 is laterally adjacent the first epitaxial layer 14 as shown in FIG. 34. The second epitaxial layer 16 can also be doped more lightly than the first epitaxial layer 14 if desired, e.g. if the first device region 18 includes DMOS devices and the second device region 20 includes CMOS devices. An upper portion of the second epitaxial layer 16 is removed e.g. via CMP together with epitaxial artifacts 120 on the mask layer 120 so that the second epitaxial layer 16 is thicker than the first epitaxial layer 14 as shown in FIG. 35. The semiconductor devices of the first type are then formed in the first epitaxial layer 14 and the semiconductor devices of the second type are formed in the second epitaxial layer 16 as shown in FIG. 36.

FIGS. 37-42 illustrate still another embodiment of a selective epitaxial process for fabricating the semiconductor die 10. According to this embodiment, the substrate 12 is etched after formation of the first epitaxial layer 14 and separation of the first and second device regions 18, 20 by a deep trench 120. Separating the first and second device regions 18, 20 by a deep trench 120 early in the processing may reduce the interface area between the different device regions. In addition, process integration may be improved in that an insulated sidewall such as an $SiO_2$ sidewall is now available during epitaxial growth rather than an Si sidewall.

Figure 37:
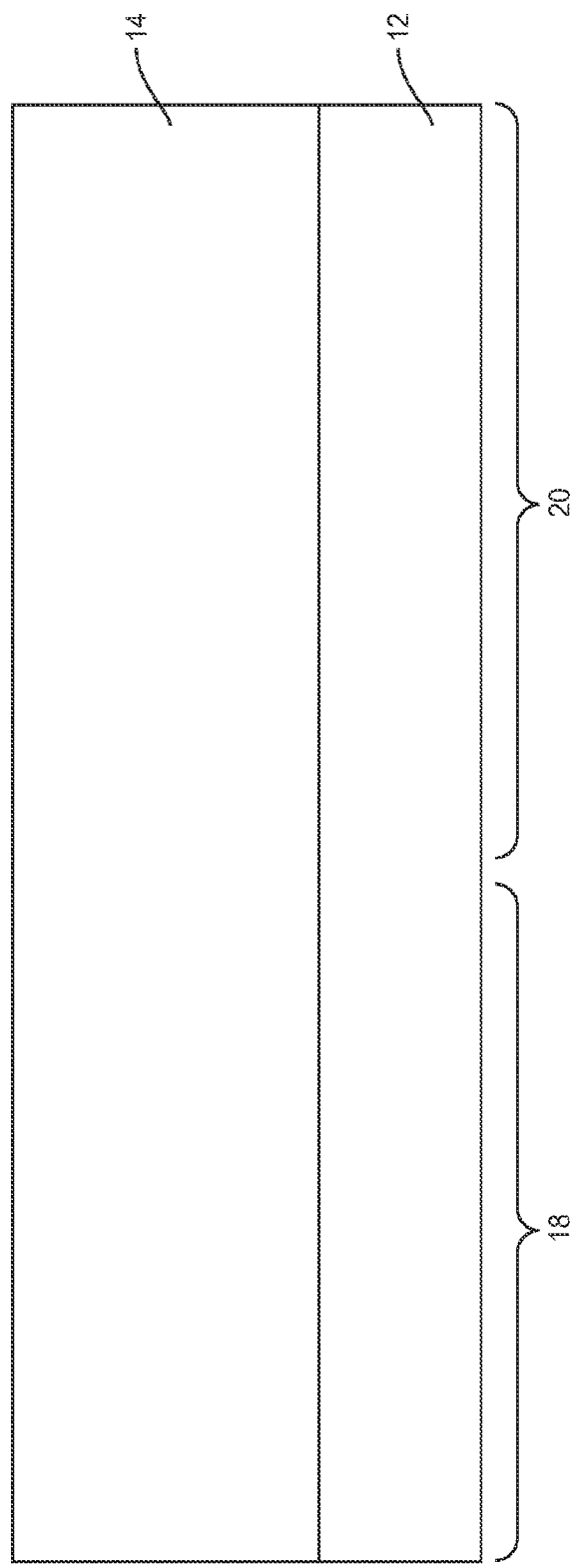
FIGS. 37-42 are schematic cross-sectional views of a semiconductor die with a first device region and a second device region integrated on the same substrate during different processing steps according to a seventh embodiment.
Figure 38:
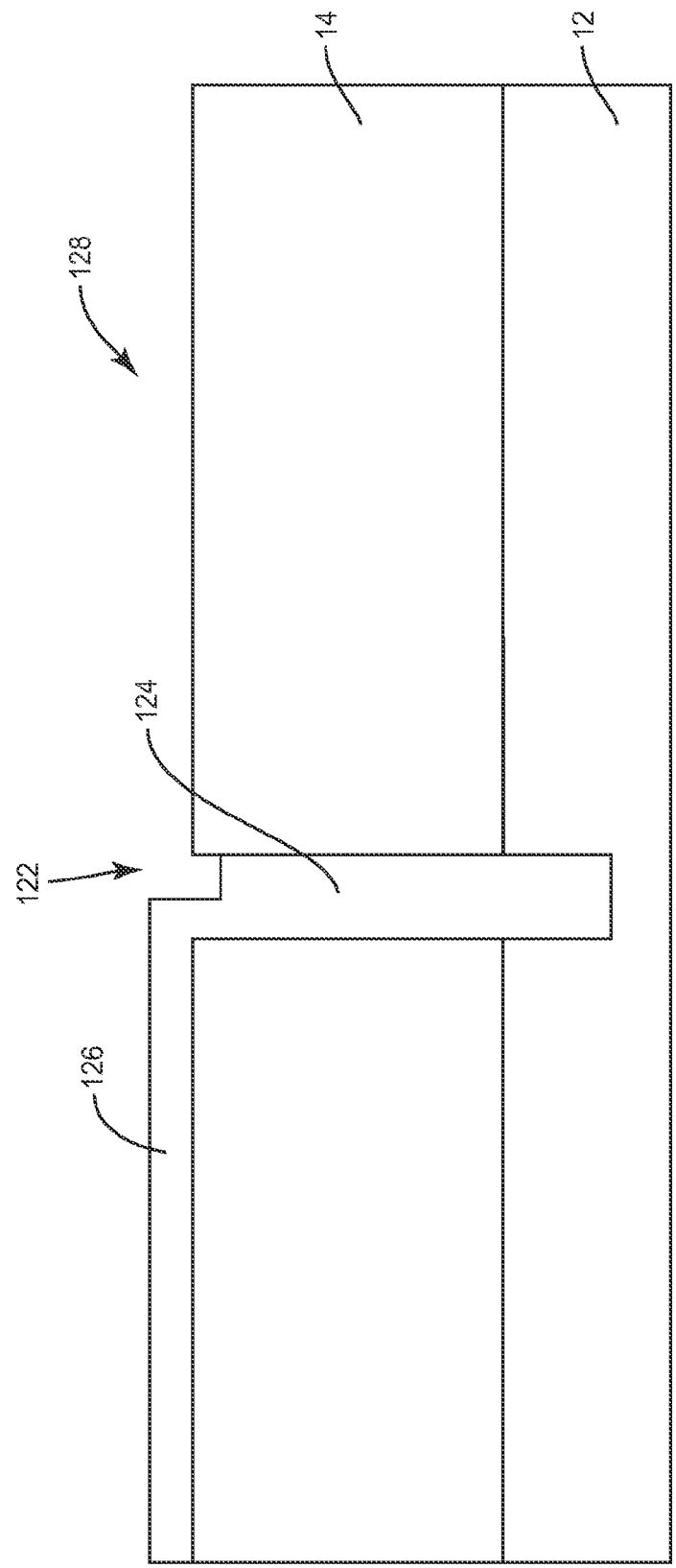
Figure 39:
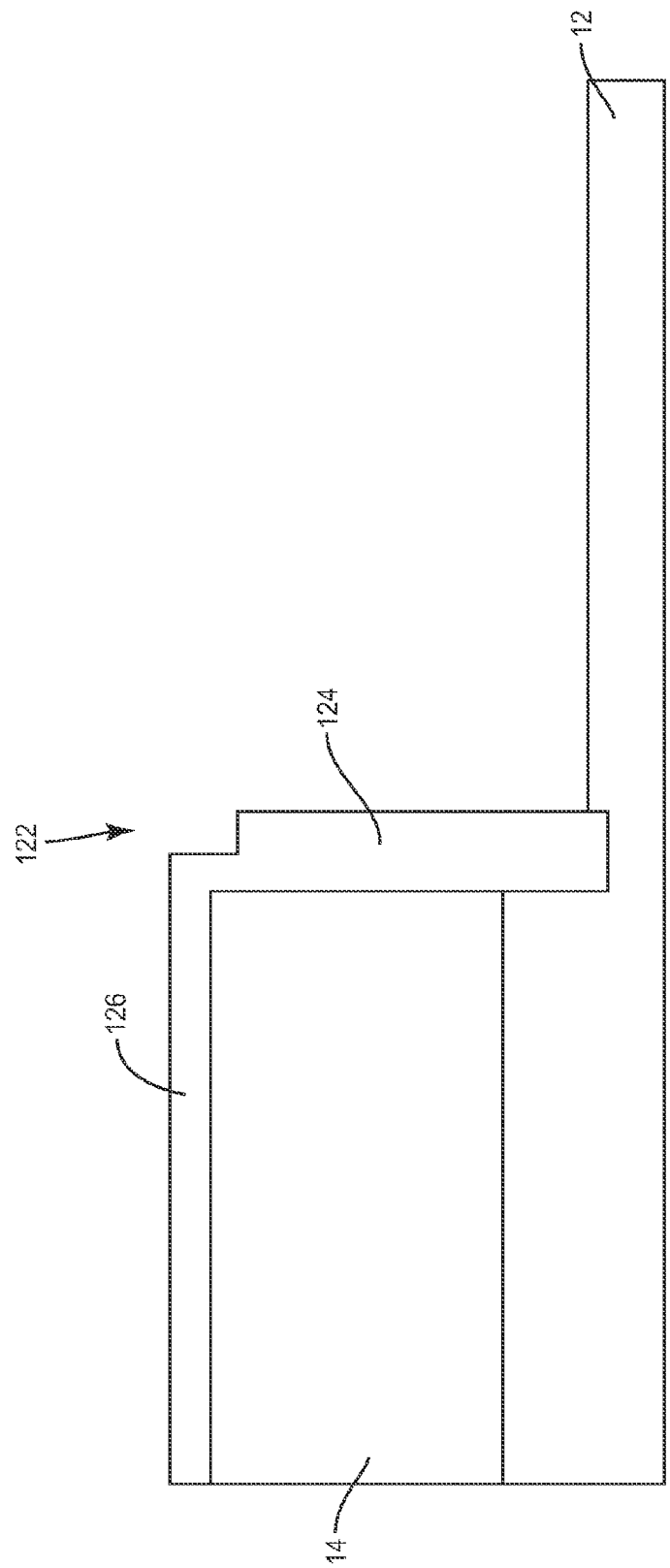
Figure 40:
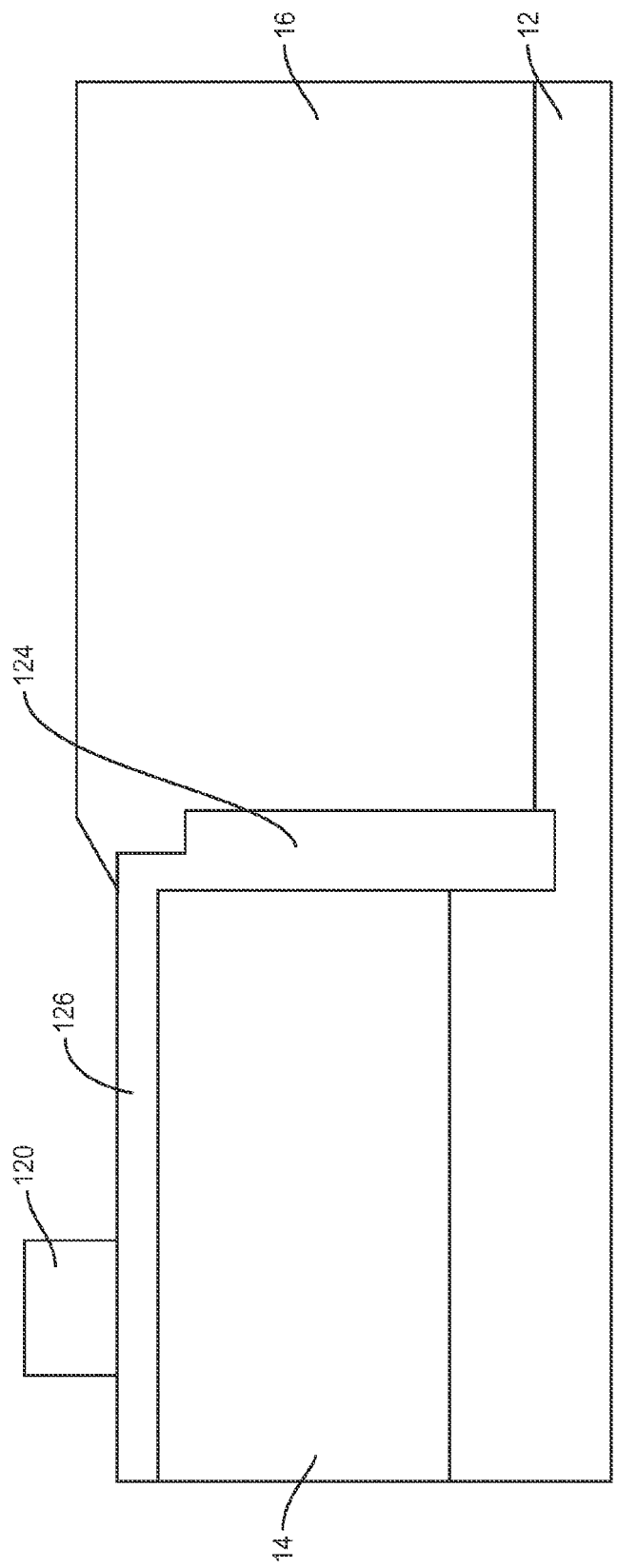
Figure 41:
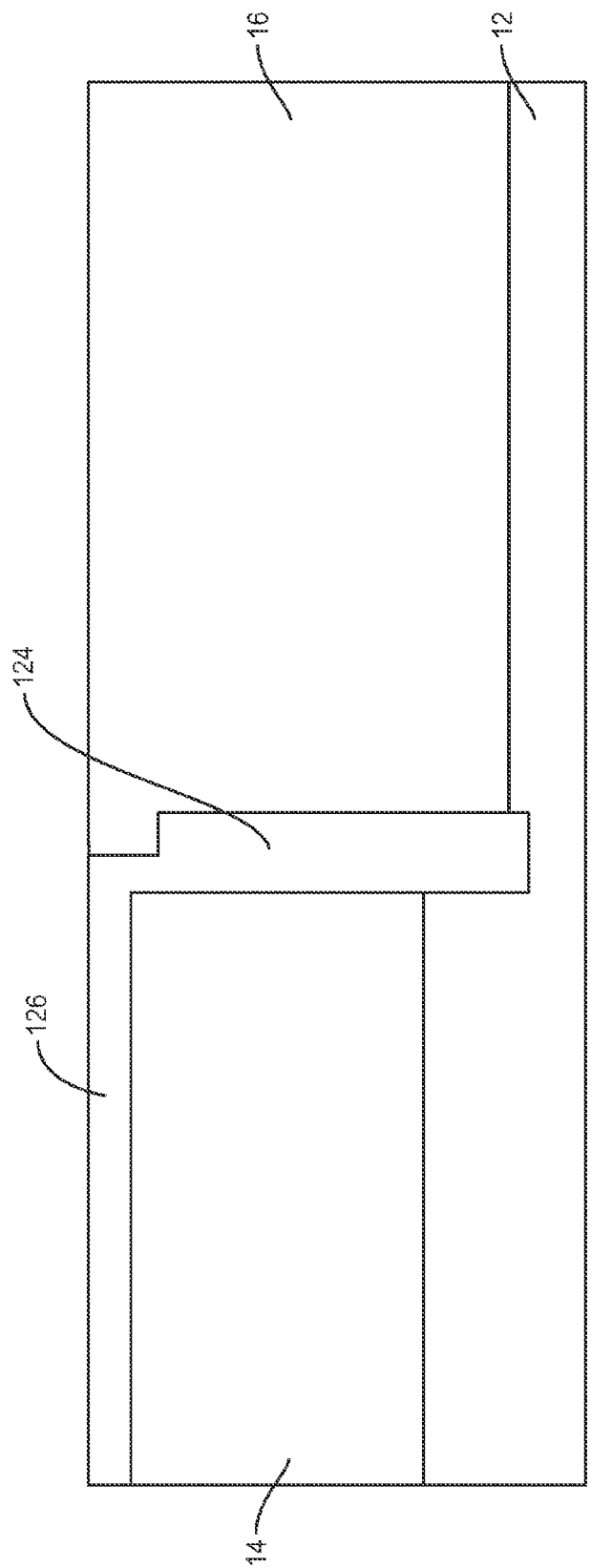
Figure 42:
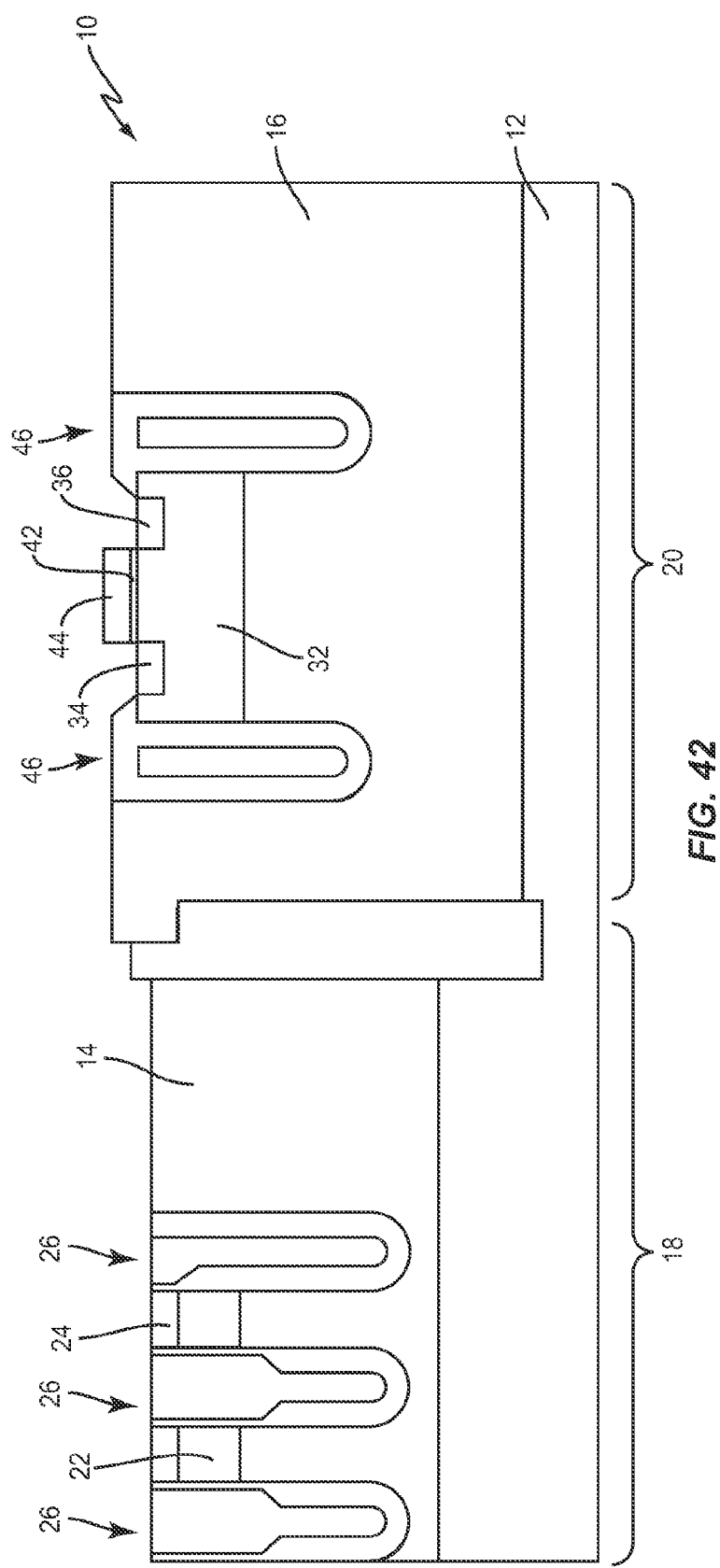

In more detail, the first epitaxial layer 14 is grown on the substrate 12 as shown in FIG. 37. An insulated trench 122 is then formed prior to etching the substrate 12, the insulated trench 122 extending through the first epitaxial layer 14 into the substrate 12 as shown in FIG. 38. The insulated trench 122 separates the first and second device regions 18, 20, and is formed by etching a trench through the first epitaxial layer 14 into the substrate 12 and filling the trench with a dielectric material 124 such as $SiO_2$. The trench may also include a conductive material (not shown) surrounded by the insulating material 124. The trench insulating material 124 disposed over the first epitaxial layer 14 forms a mask 126 which protects this region of the first epitaxial layer 14 during subsequent processing. The unmasked portion 128 of the first epitaxial layer 14 is removed e.g. via plasma etching so that the substrate 12 is exposed and etched in the second device region 20 as shown in FIG. 39. The second epitaxial layer 16 is then grown over the exposed part of the substrate 12 so that the second epitaxial layer 16 is laterally adjacent the first epitaxial layer 14 as shown in FIG. 40. The second epitaxial layer 16 is planarized e.g. via CMP to remove artifacts 128 on the mask layer 126 formed on the first epitaxial layer 14 so that the second epitaxial layer 16 is thicker than the first epitaxial layer 14 as shown in FIG. 41. The semiconductor devices of the first type are then formed in the first epitaxial layer 14 and the semiconductor devices of the second type are formed in the second epitaxial layer 16 as shown in FIG. 42.

Figure 43:
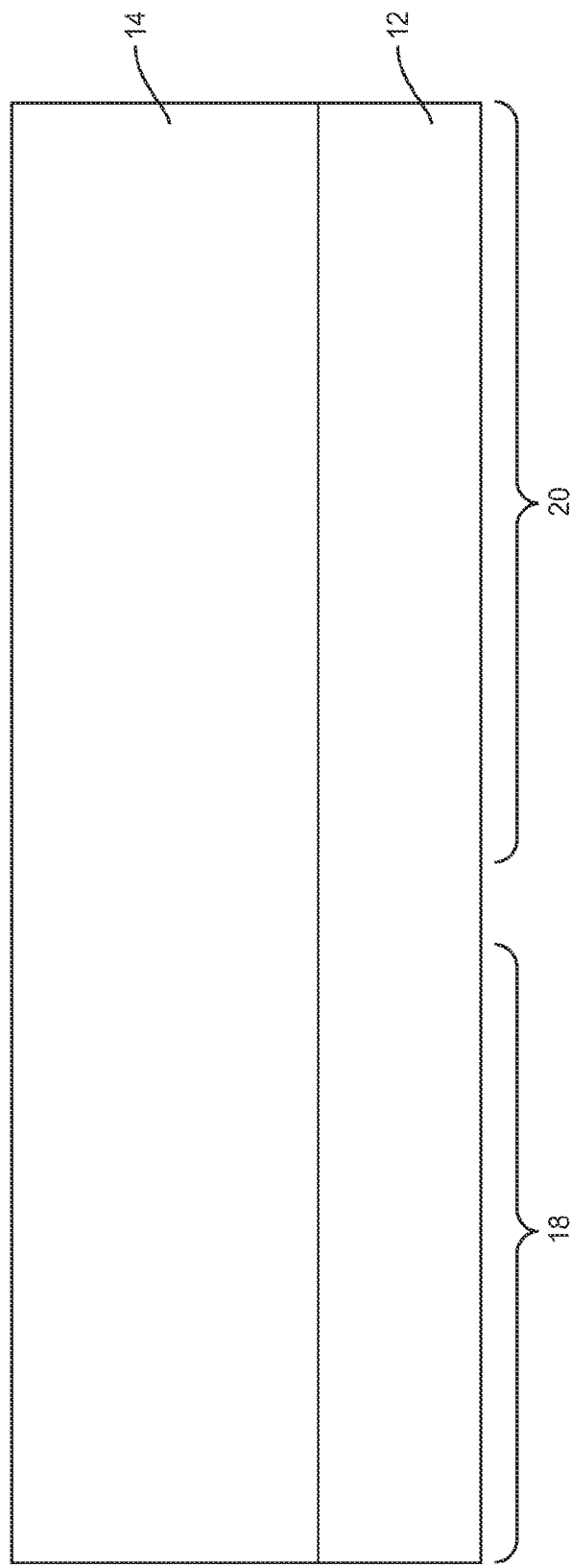
FIGS. 43-48 are schematic cross-sectional views of a semiconductor die with a first device region and a second device region integrated on the same substrate during different processing steps according to an eighth embodiment.
Figure 44:
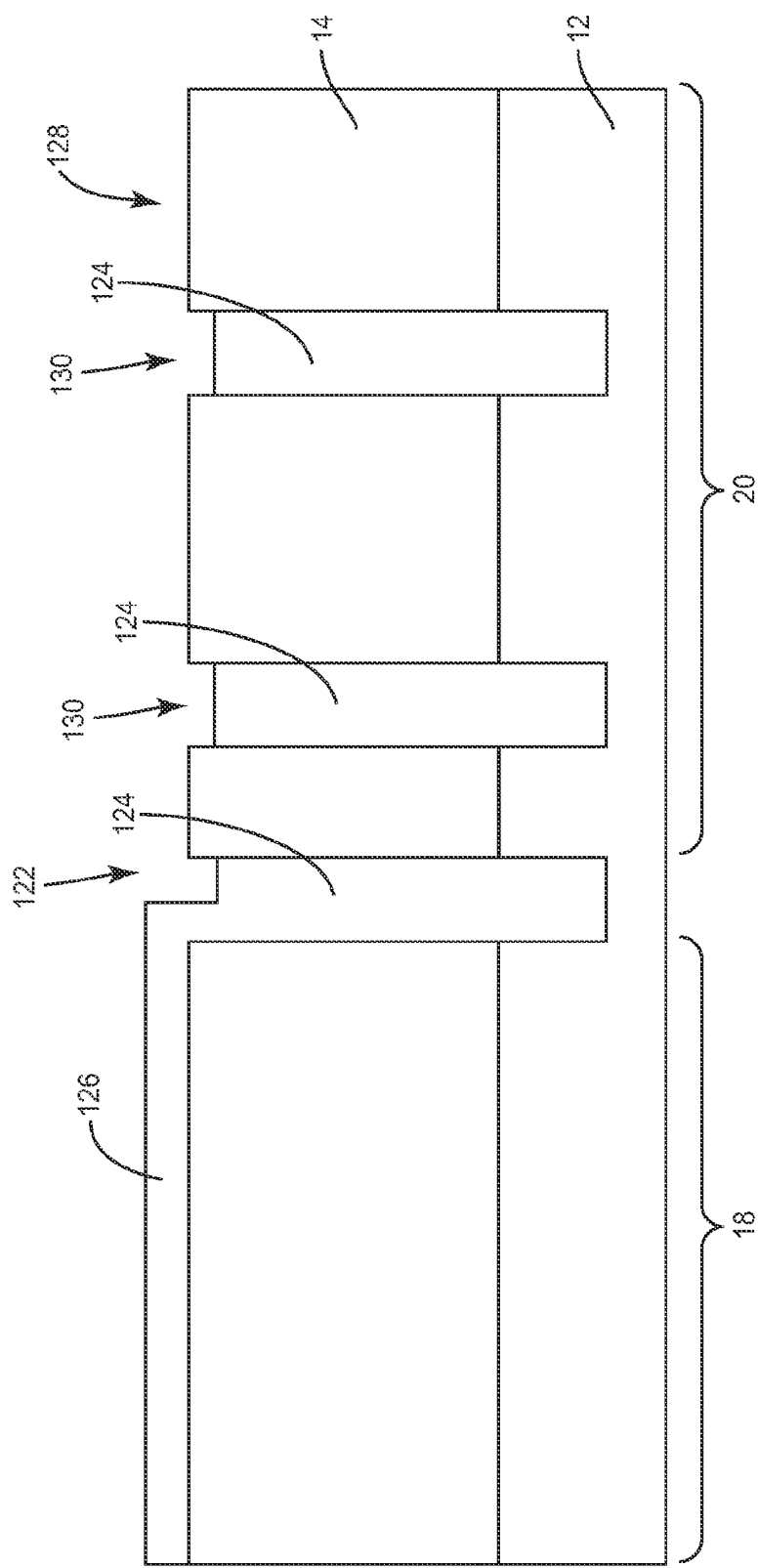

FIGS. 43-48 illustrate still another embodiment of a selective epitaxial process for fabricating the semiconductor die 10. According to this embodiment, the substrate 12 is etched after formation of the first epitaxial layer 14 and separation of the first and second device regions 18, 20 by a deep trench 122 as described above. Additional deep trenches 130 are also formed in the second device region 20 prior to substrate etching to provide well isolation. In more detail, the first epitaxial layer 14 is grown on the substrate 12 as shown in FIG. 43. The insulated trench 122 that separates the device regions is then formed prior to etching the substrate 12, the insulated trench 122 extending through the first epitaxial layer 14 into the substrate 12 as shown in FIG. 44. Additional insulated trenches 130 are formed in the second device region 20 which extend through the first epitaxial layer 14 into the substrate 12. The insulated trenches 122, 130 are formed by etching a trench through the first epitaxial layer 14 into the substrate 12 and filling each trench 122, 130 with a dielectric material 124 such as SiO$_2$. The trenches 122, 130 may also include a conductive material (not shown) surrounded by the insulating material 124. The trench insulating material 124 disposed over the first epitaxial layer 12 forms a mask 126 for protecting the first epitaxial layer 12 over the first device region 18 during subsequent as previously explained herein.

Figure 45:
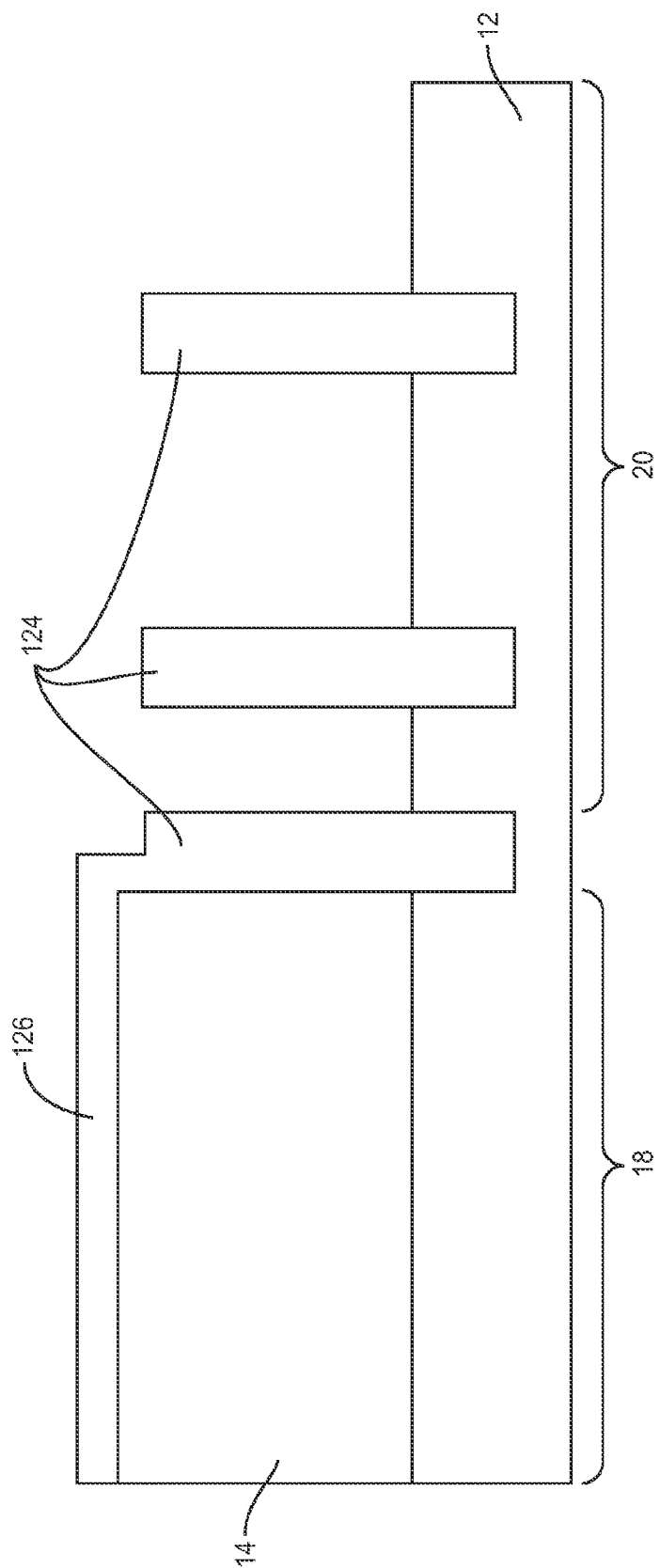
Figure 46:
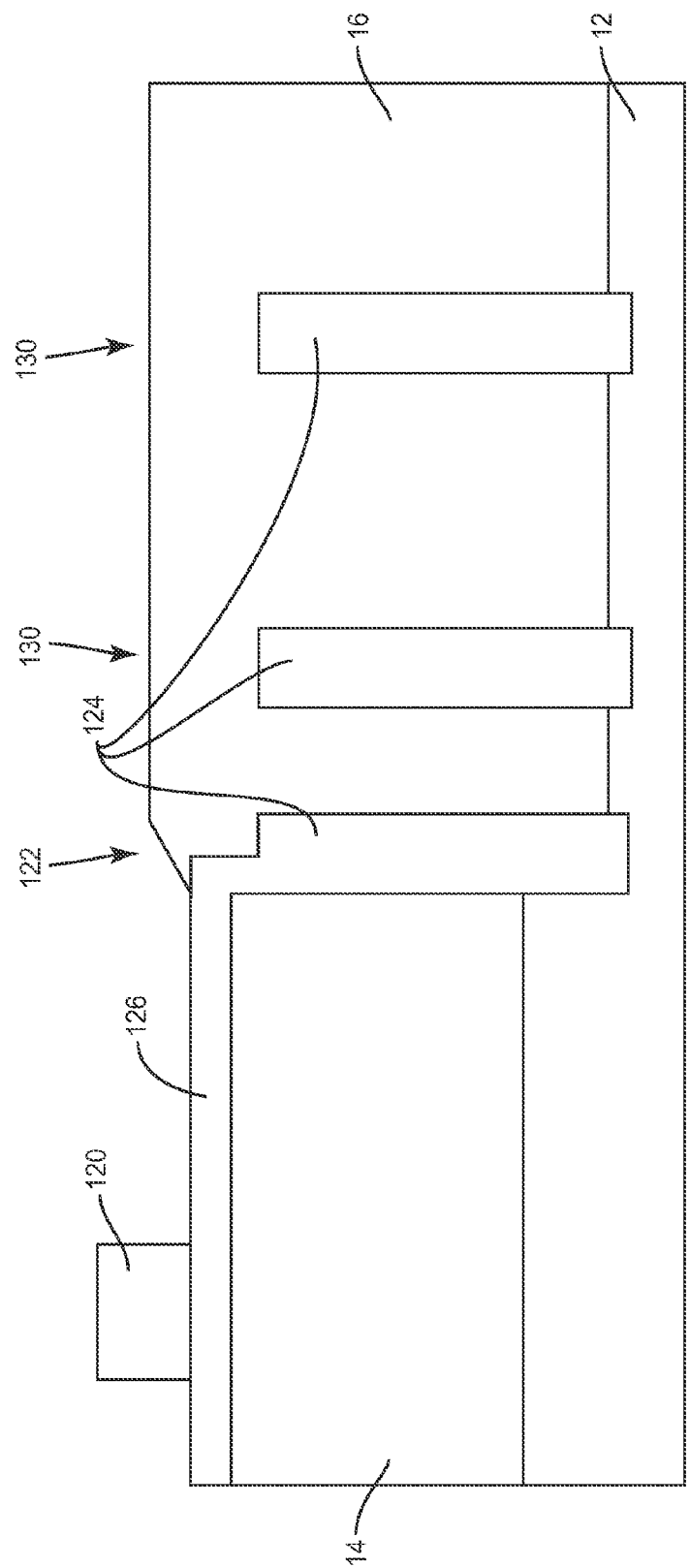
Figure 47:
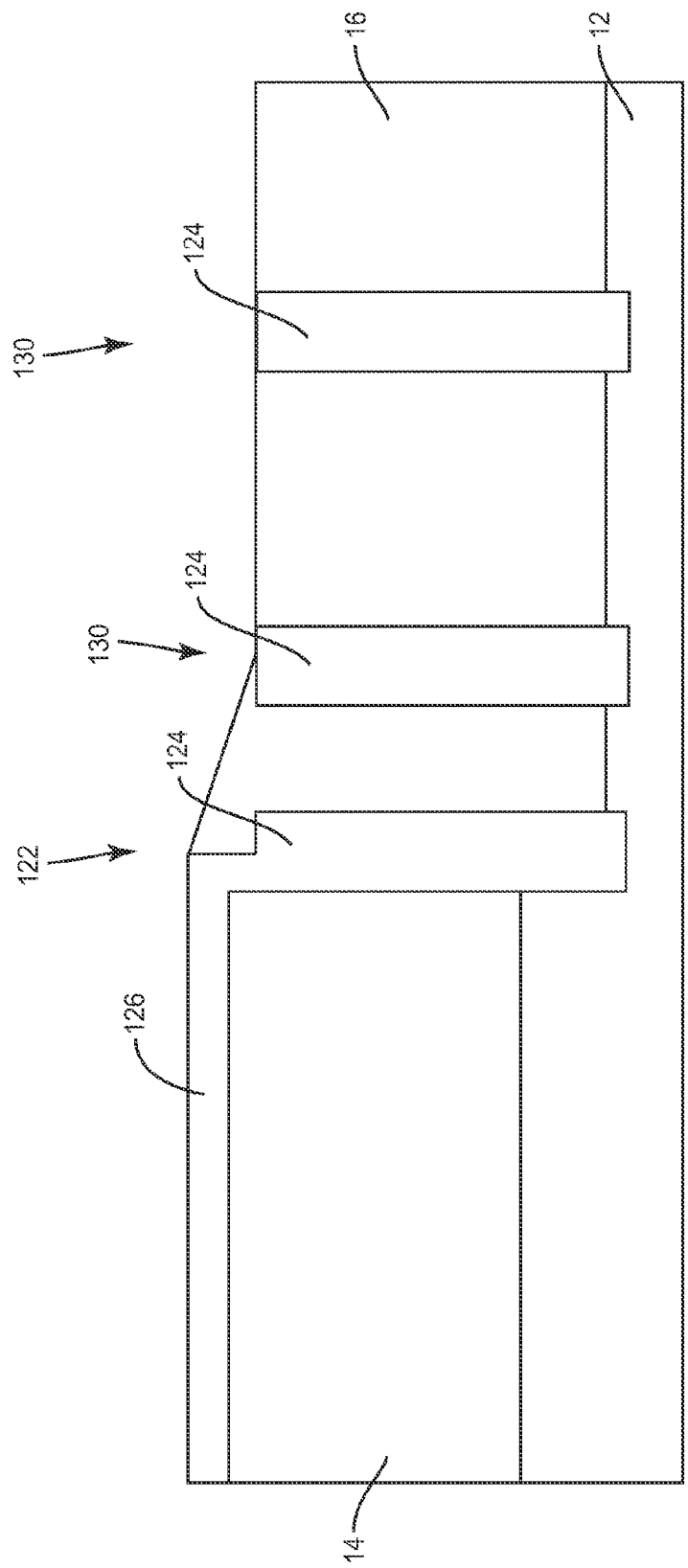
Figure 48:
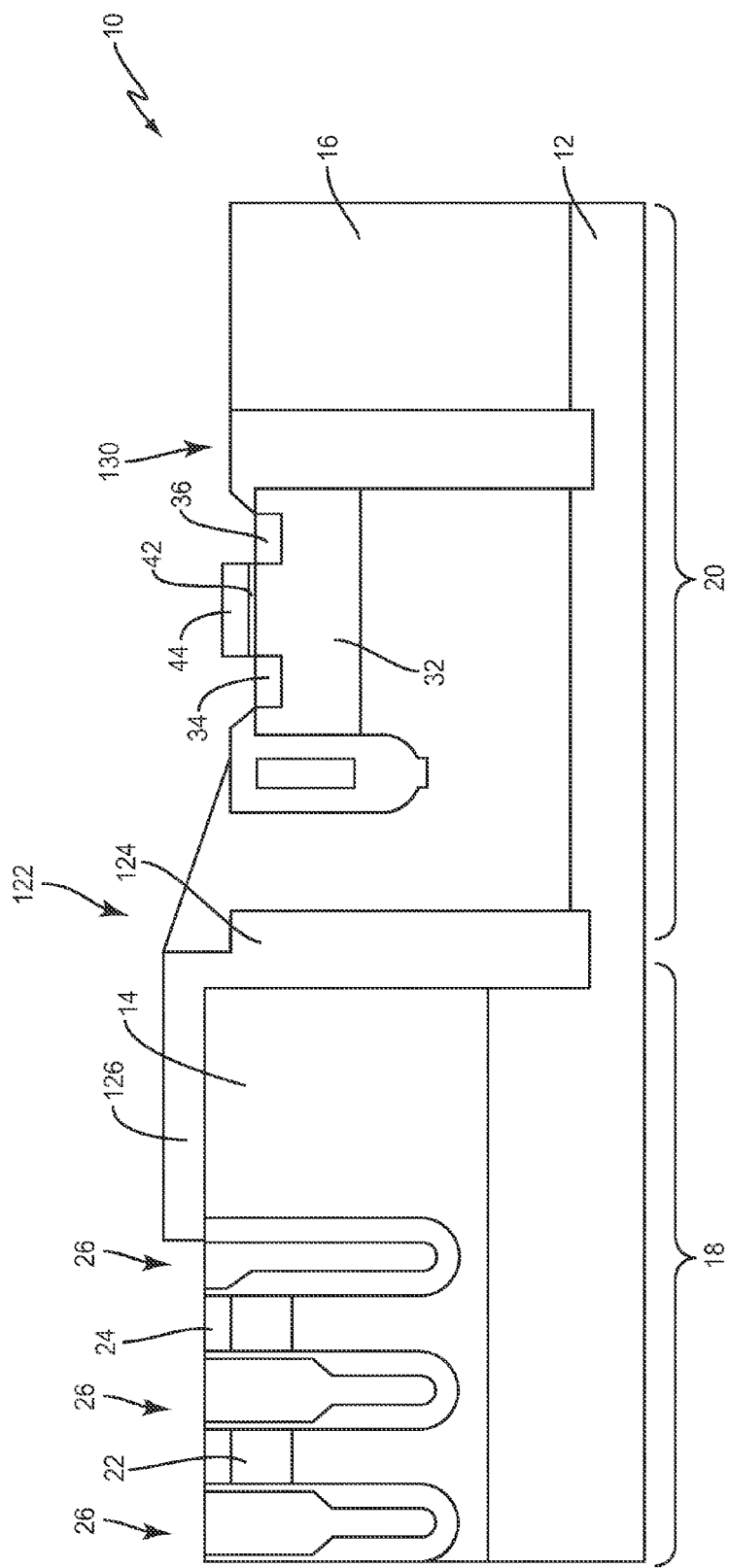

The unmasked portion 128 of the first epitaxial layer 14 is then removed e.g. via plasma etching so that the substrate 12 is exposed and etched in the second device region 20 as shown in FIG. 45. The second epitaxial layer 16 is then grown on the exposed part of the substrate 12 around the well isolation trenches 130 in the second device region 20 so that the second epitaxial layer 16 is laterally adjacent the first epitaxial layer 14 as shown in FIG. 46. The second epitaxial layer 16 is planarized e.g. via CMP to remove artifacts 120 on the mask layer 126 formed over the first epitaxial layer 14 as shown in FIG. 47. The semiconductor devices of the first type are then formed in the first epitaxial layer 14 and the semiconductor devices of the second type are formed in the second epitaxial layer 16 as shown in FIG. 48. This includes forming a well region 32 in the second epitaxial layer 16 as previously described herein. The well region 32 is laterally isolated by the well isolation trenches 130 that extend into the substrate 12 in the second device region 20.

Spatially relative terms such as "under", "below", "lower", "over", "upper" and the like, are used for ease of description to explain the positioning of one element relative to a second element. These terms are intended to encompass different orientations of the device in addition to those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
a substrate;
a first epitaxial layer on the substrate;
a second epitaxial layer that is formed on a portion of the first epitaxial layer;
a first device region including the first epitaxial layer and one or more semiconductor devices of a first type formed in the first epitaxial layer of the first device region;
a second device region spaced apart from the first device region and including the second epitaxial layer and one or more semiconductor devices of a second type formed in the second epitaxial layer of the second device region;
wherein the first epitaxial layer is different than the second epitaxial layer so that the one or more semiconductor devices of the first type are formed in a different epitaxial layer than the one or more semiconductor devices of the second type; and
wherein the first epitaxial layer forms a continuous layer on the substrate between the first device region and the second device region.

2. The semiconductor die of claim 1, wherein the first device region is vertically offset from the second device region on the substrate.

3. The semiconductor die of claim 1, wherein a step formed in the substrate separates the first device region from the second device region.

4. The semiconductor die of claim 3, wherein the step is oblique.

5. The semiconductor die of claim 3, wherein one or more of the semiconductor devices in the first device region touch or reach into the step so that the step is part of an edge termination of the one or more semiconductor devices.

6. The semiconductor die of claim 1, wherein the first epitaxial layer has at least one of a different thickness and a different doping concentration than the second epitaxial layer.

7. The semiconductor die of claim 6, wherein the first device region is devoid of the second epitaxial layer.

8. The semiconductor die of claim 7, wherein trenches formed in the second device region have a greater height than trenches formed in the first device region and extend through the second epitaxial layer into the first epitaxial to the same depth in the first epitaxial layer as the trenches formed in the first device region.

9. The semiconductor die of claim 6, wherein the first epitaxial layer and the second epitaxial layer have the same conductivity type, a third epitaxial layer of the opposite conductivity type is interposed between the first epitaxial layer and the second epitaxial layer in the second device region, and a well region having the same conductivity type as the third epitaxial layer is disposed in the second epitaxial layer over the third epitaxial layer.

10. The semiconductor die of claim 6, wherein the first epitaxial layer is interposed between the substrate and the second epitaxial layer in the first and second device regions.

11. The semiconductor die of claim 10, wherein the second epitaxial layer has a greater height in the second device region than in the first device region.

12. The semiconductor die of claim 10, wherein the one or more semiconductor devices of the first type are formed in the first epitaxial layer below the second epitaxial layer.

13. The semiconductor die of claim 1, wherein the first epitaxial layer has a 3× to 30× higher doping concentration than the second epitaxial layer and the second epitaxial layer is between 1.3 and 4 times as thick as the first epitaxial layer.

14. The semiconductor die of claim 1, comprising a first epitaxial layer on the substrate and a second epitaxial layer on the substrate laterally adjacent the first epitaxial layer so that the substrate is covered by the first epitaxial layer in first device region and by the second epitaxial layer in the second device region, wherein the second epitaxial layer is more lightly doped and/or thicker than the first epitaxial layer, the one or more semiconductor devices of the first type are formed in the first epitaxial layer and the one or more semiconductor devices of the second type are formed in the second epitaxial layer.

15. The semiconductor die of claim 1, wherein the one or more semiconductor devices of the first type are DMOS transistors and the one or more semiconductor devices of the second type comprise at least one of MOS, bipolar, JFET, diode, capacitor and resistor devices.

16. The semiconductor die of claim 1, wherein the first epitaxial layer has a different doping type than the second epitaxial layer.

17. The semiconductor die of claim 1, wherein at least one of the first device region and the second device region includes a plurality of spaced apart areas on the semiconductor die.

* * * * *